United States Patent [19]
Lambertson

[11] Patent Number: 5,544,103
[45] Date of Patent: Aug. 6, 1996

[54] COMPACT PAGE-ERASABLE EEPROM NON-VOLATILE MEMORY

[75] Inventor: Roy T. Lambertson, Palo Alto, Calif.

[73] Assignee: XICOR, Inc., Milpitas, Calif.

[21] Appl. No.: 273,612

[22] Filed: Jul. 12, 1994

Related U.S. Application Data

[63] Continuation of Ser. No. 845,392, Mar. 3, 1992, abandoned.

[51] Int. Cl.⁶ .................................................. G11C 16/04
[52] U.S. Cl. .............................. 365/185.15; 365/185.31; 365/185.2; 365/185.08; 365/63; 365/72; 257/316; 257/321; 257/322
[58] Field of Search .............................. 365/185, 63, 72, 365/218; 257/316, 321, 322

[56] References Cited

U.S. PATENT DOCUMENTS

| | | | |
|---|---|---|---|
| 4,326,134 | 4/1982 | Owens et al. | 307/268 |
| 4,328,565 | 8/1982 | Harari | 365/185 |
| 4,599,706 | 7/1986 | Guterman | 365/185 |
| 4,639,893 | 1/1987 | Eitan | 365/185 |
| 4,701,776 | 10/1987 | Perlegos et al. | 357/23.5 |
| 4,783,766 | 11/1988 | Samachisa et al. | 365/185 |
| 4,822,750 | 4/1989 | Perlegos et al. | 437/052 |
| 4,855,955 | 8/1989 | Cioaca | 365/185 |
| 4,868,629 | 9/1989 | Eitan | 357/45 |
| 4,939,690 | 7/1990 | Momodomi et al. | 365/185 |
| 4,959,812 | 9/1990 | Momodomi et al. | 365/185 |
| 4,996,669 | 2/1991 | Endoh et al. | 365/185 |
| 5,021,847 | 6/1991 | Eitan et al. | 357/23.5 |
| 5,029,130 | 7/1991 | Yeh | 365/185 |
| 5,045,488 | 9/1991 | Yeh | 437/43 |
| 5,067,108 | 11/1991 | Jenq | 365/185 |
| 5,172,335 | 12/1992 | Sasaki et al. | 365/63 |
| 5,172,338 | 12/1992 | Mehrotra et al. | 365/185 |
| 5,202,850 | 4/1993 | Jenq | 365/185 |
| 5,270,979 | 12/1993 | Harari et al. | 365/218 |
| 5,313,421 | 5/1994 | Guterman et al. | 365/185 |

FOREIGN PATENT DOCUMENTS

| | | |
|---|---|---|
| 0361972A2 | 4/1990 | European Pat. Off. . |
| 0365720A1 | 5/1990 | European Pat. Off. . |
| 0365721A1 | 5/1990 | European Pat. Off. . |
| 0373830A2 | 6/1990 | European Pat. Off. . |
| 2-210869 | 8/1990 | Japan . |

OTHER PUBLICATIONS

Guterman, et al., "An Electrically Alterable Nonvolatile Memory Cell Using A Floating–Gate Structure," IEEE *Journal of Solid–State Circuits*, vol. SC–14, No. 2, Apr. 1979.

(List continued on next page.)

*Primary Examiner*—Joseph E. Clawson, Jr.
*Attorney, Agent, or Firm*—Coudert Brothers

[57] ABSTRACT

A compact, electrically-erasable and electrically-programmable nonvolatile memory device employing novel programming and erasing techniques and using two layers of conductive or semiconductive material is disclosed. The memory cell of the present invention comprises a first layer serving as a floating gate and a second layer serving the functions of erasing the floating gate and of selecting the device for reading and programming the floating gate. The second layer may be made common to more than one memory device of the present invention. Programming of the device occurs by tunneling electrons into the first layer (floating gate) by hot-electron injection from a channel region controlled by the second layer. In one preferred embodiment of the present invention, erasure of the memory cell occurs by causing the tunneling of electrons from the first layer (floating gate) to the second layer by an enhanced tunneling mechanism. In this embodiment, the second layer preferably comprises a word line or row of a memory array. The erasure from the first layer (floating gate) to the second layer (word line) facilitates the providing of a compact, page-alterable non-volatile memory array. In a second preferred embodiment of the present invention, bit line coupling to the floating gate is used in place of the standard word-line coupling to the floating gate. The bit-line coupling also facilitates the providing of a compact, page-alterable non-volatile memory.

37 Claims, 4 Drawing Sheets

OTHER PUBLICATIONS

R. Kazerounian, et al., "A 5 Volt High Density Poly—Poly Erase Flash EPROM Cell," *Proceedings of the International Election Devices Meeting*, Dec. 1988.

O. Bellezza, et al., "A New Self–Aligned Field Oxide Cell for Multimegabit EPROMS," *Proceedings of the International Electron Devices Meeting*, Dec. 1989.

B. J. Woo, et al., "A Novel Memory Cell Using Flash Array Contactless EPROM (FACE) Technology," *Proceedings of the IEEE International Electron Devices Meeting*, Dec. 1990.

J. Van Houdt, et al., "A 5–Volt–Only Fast–Programmable Flash EEPROM Cell with a Double Polysilicon Split–Gate Structure," *Proceedings of the IEEE NVSM*, Feb. 1991.

Philip J. Cacharelis, et al., "A Modular 1 um CMOS Technology Merging EEPROM, EPROM, and Interpoly Capacitors," *Proceedings of the IEEE 11th NVSM*, Feb. 1991.

Ali, et al., "A 50–ns 256K CMOS Split–Gate EPROM," *IEEE Journal of Solid–State Circuits*, vol. 23, No. 1, Feb. 1988.

Samachisa, et al., "A 128K Flash EEPROM Using Double–Polysilicon Technology," *IEEE Journal of Solid–State Circuits*, vol. SC–22, No. 5, Oct. 1987.

Mukherjee, et al., "A Single Transistor EEPROM Cell and its Implementation in a 512K CMOS EEPROM," *Proceedings of the IEDM*, Dec. 1985.

Tam, et al., "A High Density CMOS 1–T Electrically Erasable Non–volatile (Flash) Memory Technology," *Proceedings of the 1988*.

Nakayama, et al. "A 5–V–Only One–Transistor 256K EEPROM with Page–Mode Erase," *IEEE Journal of Solid–State Circuits*, vol. 24, No. 4, Aug. 1989.

Masuoka, et al., "A New Flash $E^2$PROM Cell Using Triple Polysilicon Technology", *Proceedings of the IEDM*, Dec. 1984.

Wu, et al., "A Source–Side Injection Erasable Programmable Read–Only–Memory (SI–EPROM) Device," *IEEE Electron Device Letters*, vol. EDL–7, No. 9, Sep. 1986.

Mitzutani, et al., "A New–EPROM Cell With A Side–Wall Floating Gate for High–Density and High–Performance Device," *Proceedings of the IEDM*, Dec. 1985.

Chu, et al., "The Effect of Trench–Gate–Oxide Structure on EPROM Device Operation," *IEEE Electron Device Letters*, vol. 9, No. 6, Jun. 1988.

Seki, et al., "An 80–ns 1–Mb Flash Memory with On–Chip Erase/Erase–Verify Controller," *IEEE Journal of Solid–State Circuits*, vol. 25, No. 5, Oct. 1990.

Komori, et al., "A High Performance Memory Cell Technology for Mega Bit EPROMS," *Proceedings of the IEDM*, Dec. 1985.

Lai, et al., "Design Of An $E^2$PROM Memory Cell Less than 100 Square Microns Using 1 Micron Technology," *Proceedings of the IEDM*, Dec. 1984.

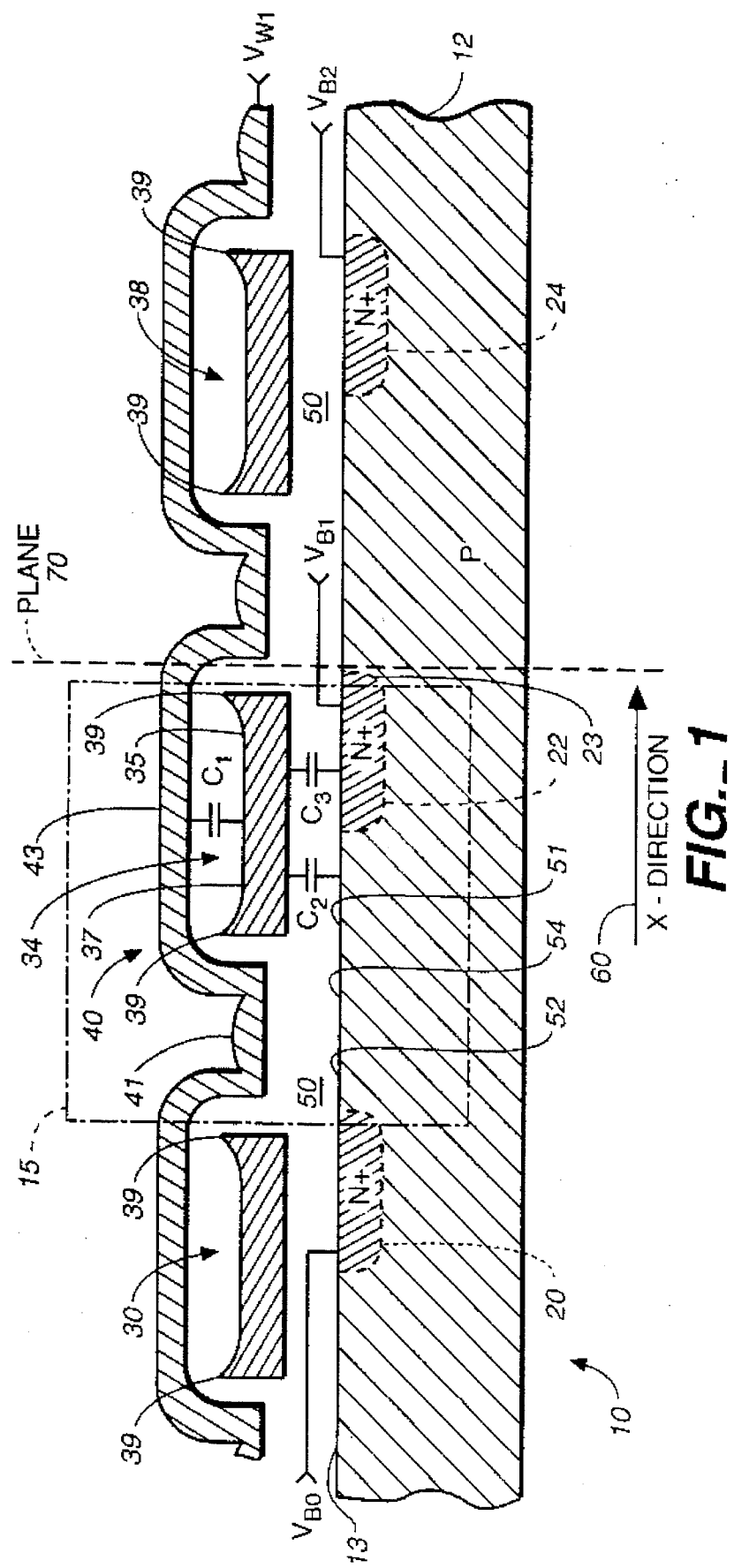
FIG._1

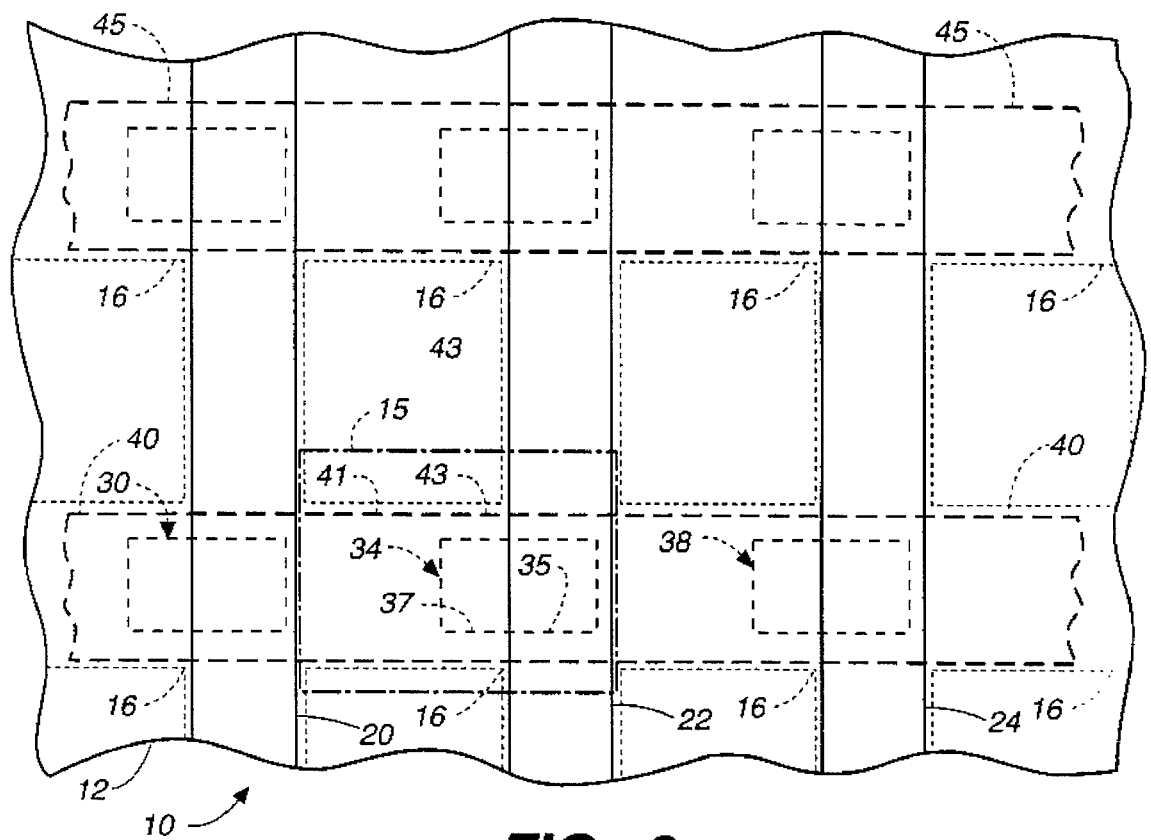
FIG._2
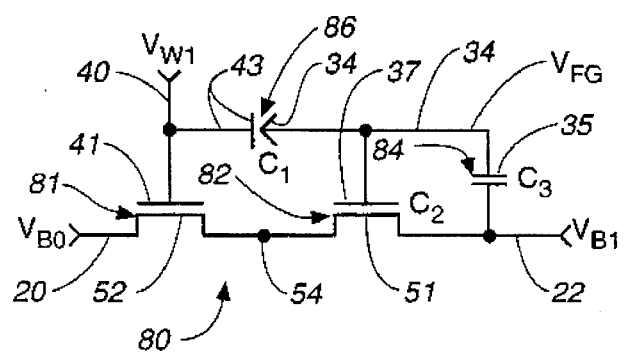
FIG._3

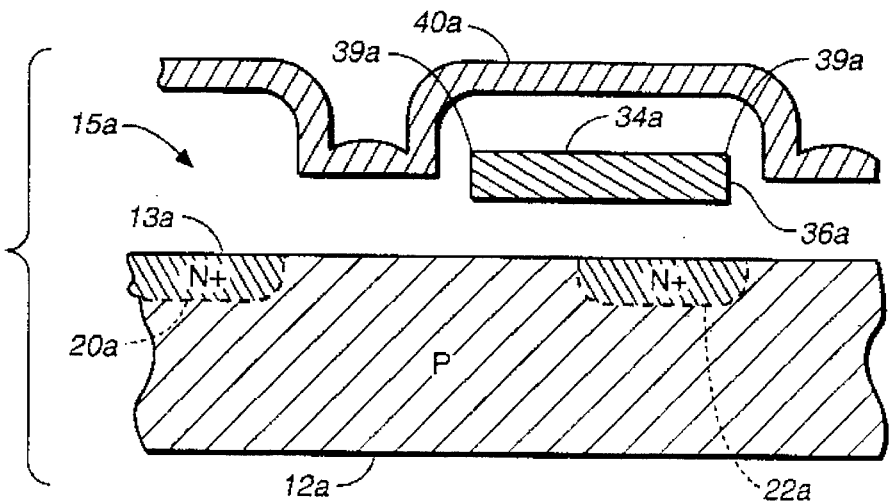
FIG._4A
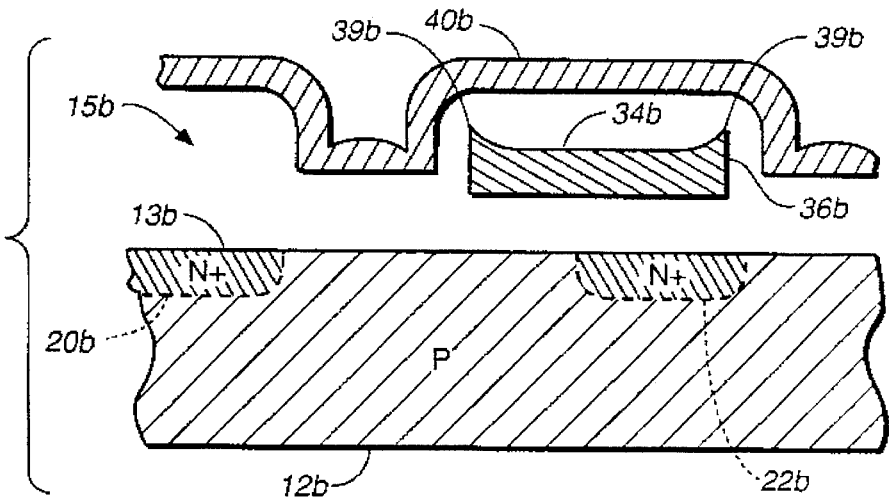
FIG._4B
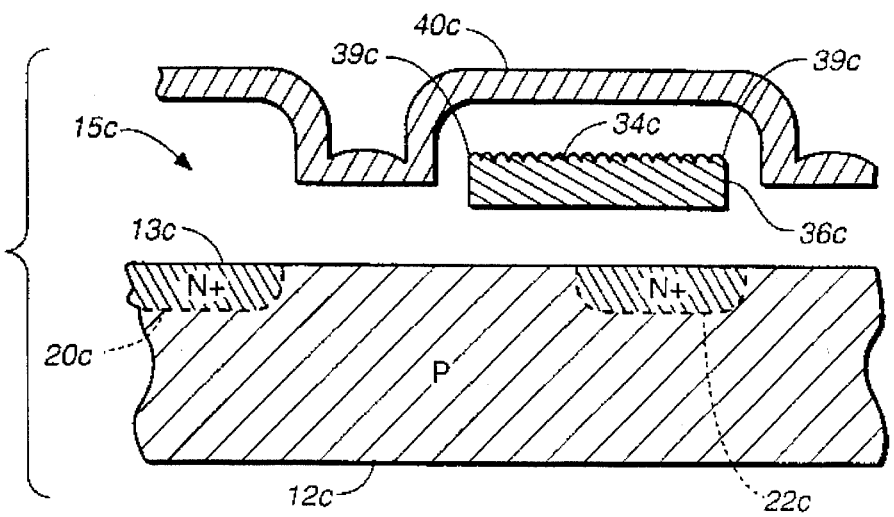
FIG._4C

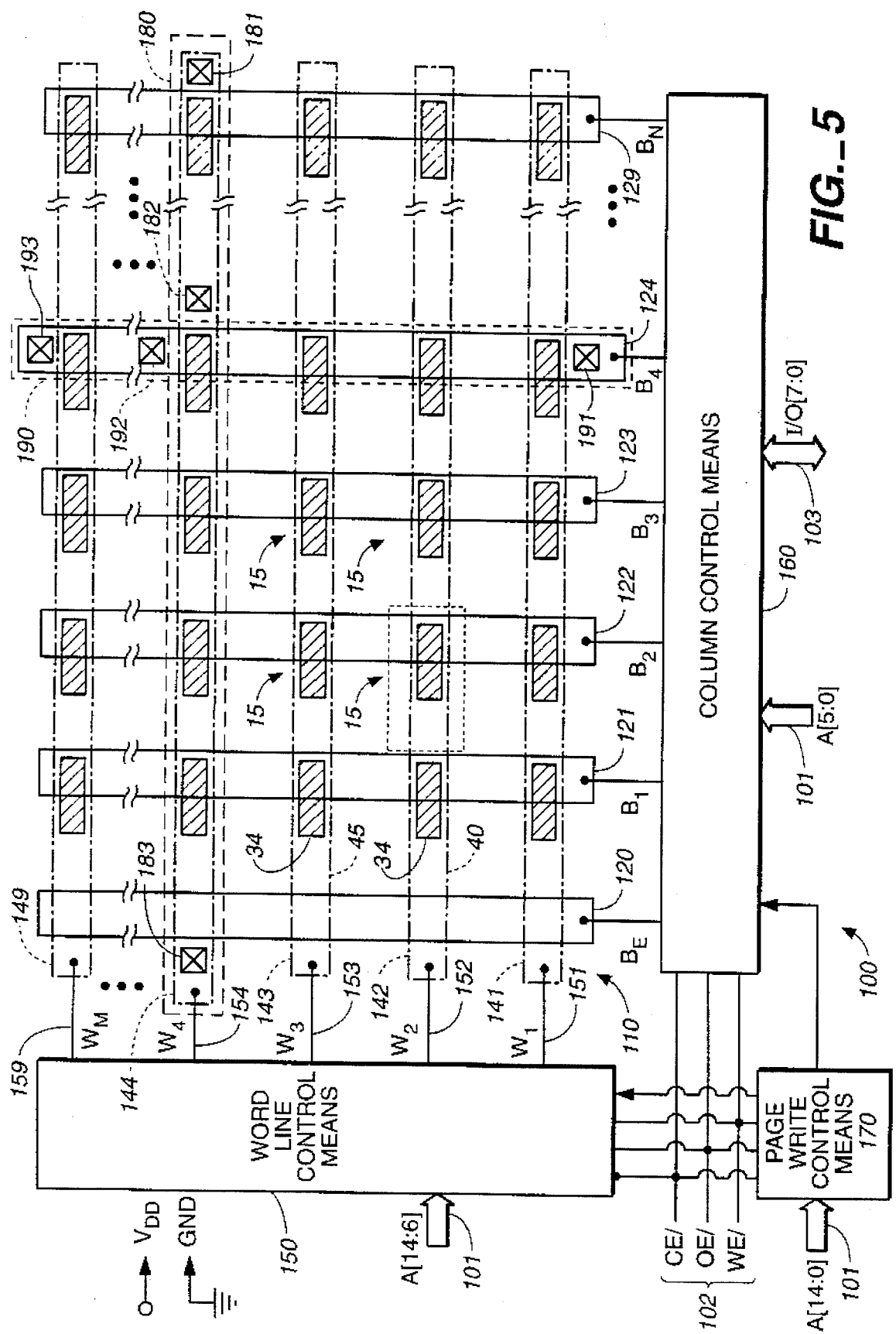
FIG._5

COMPACT PAGE-ERASABLE EEPROM NON-VOLATILE MEMORY

This application is a continuation of application Ser. No. 07/845,392, filed Mar. 3, 1992, abandoned.

FIELD OF THE INVENTION

The present invention relates generally to integrated circuit programmable nonvolatile memory devices, and particularly to an improved nonvolatile memory cell which enables the density of nonvolatile memory cells in such memory devices to be increased.

BACKGROUND OF THE INVENTION

In general, nonvolatile semiconductor memory devices can be classified into two groups: electrically programmable read-only memories (EPROMs) and electrically erasable and programmable read-only memories (EEPROMs). Each of these devices, EPROM and EEPROM, usually includes a floating gate element which is electrically isolated from other conductors in the device and which is used to store electrons in varying amounts. The storage of electrons on the floating gate in varying amounts provides a means for storing binary digital information. For example, a charge level above a predetermined level may be used to represent a first binary state whereas a charge level below the predetermined level may be used to represent a second binary state.

The EPROM and EEPROM devices differ in one respect by the way each device introduces electrons onto the floating gate and by the way each device removes electrons from the floating gate. For introducing electrons onto the floating gate, the EPROM device generally uses channel hot electron injection whereas the EEPROM device generally uses electron tunneling from an auxiliary conductor by use of the Fowler-Nordheim electron-tunneling mechanism. For removing electrons from the floating gate, the EPROM device generally uses ultraviolet-light exposure whereas the EEPROM device generally uses electron tunneling from the floating gate to an auxiliary conductor, which may be the same auxiliary conductor used in the programming operation or a different auxiliary conductor.

Presently in the non-volatile memory art, EPROM devices have a smaller cell size and a more simple cell design than EEPROM devices. EPROM devices can, therefore, be manufactured with higher densities and lower costs than EEPROM devices. In contrast, EEPROM devices provide the capabilities of erasing single bytes or pages of the memory array instead of having to erase the entire array and of performing this erasure electrically in the system environment rather than having to expose the memory device to ultra-violet (UV) light outside the system environment. A non-volatile memory device which possess these capabilities, along with a capability to electrically program a byte or page selectively, is often referred to as a 'full-featured' non-volatile memory device. To provide all of these capabilities, EEPROM devices have one or more control electrodes for capacitively 'steering' the potential on the floating gate. Such control electrodes increase the cell size of the EEPROM cell. Separate select gates and lithographically-defined tunnel oxide areas also increase the size of the typical EEPROM cell relative to the EPROM cell. As such, there is currently a trade-off in the non-volatile memory art between the compact size of an EPROM non-volatile memory cell and the 'full-featured' capabilities of an EEPROM non-volatile memory cell.

There is, therefore, a great need to provide full-featured capabilities in a non-volatile memory device while achieving a more compact memory cell size. The present invention is directed toward filling this need.

One prior art solution to this problem is shown in the reference Guterman, et al., "An Electrically Alterable Non-volatile Memory Cell Using a Floating-Gate Structure," *IEEE Journal of Solid-State Circuits*, Vol. SC-14, No. 2, April 1978. This reference teaches a nonvolatile electrically alterable memory cell (called an "EAROM") having a floating gate spaced from the substrate to form an n-channel floating-gate transistor between a source region and a drain region. The reference further teaches a control gate having a first portion disposed above the substrate and a second portion disposed above the floating gate to provide a large capacitive coupling between the control gate and the floating gate. The first portion of the control gate is further disposed adjacent to the floating gate, the floating gate and control gate thereby forming a channel between source and drain. This channel is divided into two serial sections, one under the control of the floating-gate and the other under the direct influence of the control gate. Programming of the floating gate takes place through a direct hot-electron emission mechanism from channel to floating gate. Erasure occurs through high-field emission from floating gate to control gate. This reference teaches a high capacitive coupling between control gate and floating gate so that a substantial amount of voltage is coupled to the floating gate from the control gate during programming. This coupling of high voltage is used to increase the number of electrons tunneled from the channel to the floating gate during programming, i.e., it is used to increase tunneling efficiency. However, a consequence of using high voltage on the control gate to raise the floating gate voltage during programming is the occurrence of an undesirable erasure process during programming. This effect competes with programming of the floating gate. In this competing erasure process, electrons are also caused to tunnel from the floating gate to the control gate during programming due to the high voltage existing on the control gate during programming, thereby countering the increased tunneling from the substrate to the floating gate. In contrast, the present invention eliminates this competing erasure process.

SUMMARY OF THE INVENTION

The present invention recognizes that the above-described competing erasure process may be corrected by eliminating the use of the control gate as a means of improving electron tunneling efficiency during programming. According to the present invention, the electron tunneling efficiency between the channel and the floating gate during programming is increased, as described below. The elimination of the control gate as a means of steering the floating gate also allows the capacitance coupling between the floating gate and the control gate to be minimized. The minimizing of this capacitive coupling provides for a more compact memory cell as the large surface area used in the prior art for providing coupling between the control gate and floating gate is no longer needed.

As one means of increasing the electron tunneling efficiency, the present invention recognizes that a diffused substrate region (e.g., source, drain) may be used to couple voltage to the floating gate during programming, instead of using a control gate disposed above the floating gate. Such a substrate region may be formed underneath the floating gate to provide for a more compact memory cell. As a second means of increasing the electron tunneling efficiency during programming, the present invention recognizes that the thickness of the dielectric disposed over the channel region of the memory device, and in near proximity to the floating gate, may be varied. This variation in thickness may be provided without increasing the size of the memory cell. By increasing the efficiency of electron tunneling during programming, the present invention recognizes that programming voltages may be reduced so that memory arrays using standard supply voltages may be constructed with the present invention. Thus, these means for increasing electron tunneling efficiency aid in providing full-featured capabilities.

To further enhance full-featured capabilities, the present invention recognizes that a conductive layer (called a second layer below) may be spaced above a portion of the channel region, and dielectrically insulated therefrom, to form a "select transistor" for selecting the memory cell for programming and reading operations. Additionally, the present invention recognizes that a portion of this conductive layer may be spaced above the floating gate, and dielectrically insulated therefrom, to provide a electron tunneling means for erasure. This erasure means may be provided without the need for a large capacitance between the floating gate and this conductive layer. In this manner, the present invention addresses the above-mentioned prior art problem of the existence of a competing erasure process while providing a compact, full-featured non-volatile memory cell.

Broadly stated, the present invention encompasses an electrically-erasable and electrically-programmable non-volatile memory device. The non-volatile memory cell of the present invention comprises a substrate of a first conductivity type having a first surface, a first substrate region and a second substrate region. Each substrate region is disposed in the substrate surface and is of a second conductivity type opposite to first conductivity type of the substrate. The memory cell of the present invention further comprises a first electrically insulated conductive layer spaced from the substrate surface. The first layer serves to store information in the form of electronic charge stored thereon. The first layer has a first portion overlaying the second substrate region and a second portion overlaying a first predetermined channel area of the substrate surface, which is disposed between the first substrate region and the second substrate region.

The memory cell of the present invention further comprises a second electrically insulated conductive layer having a first portion spaced from the substrate surface and overlaying a second predetermined channel area of the substrate surface. Additionally, the first portion of the second layer is disposed generally intermediate the first substrate region and the second portion of the first layer. The second layer further has a second portion overlaying the first layer.

The memory cell of the present invention further comprises programming means for selectively tunneling electrons onto the first layer from the substrate and sense means for sensing the potential of the first layer, the potential thereon being a function of the charged stored on the first layer.

In one embodiment according to the present invention, the substrate preferably comprises a silicon wafer having a top surface and each of the first and second substrate regions comprises a respective diffused bit line disposed in the top surface of the silicon substrate. The silicon wafer is of a first conductivity type (i.e., p-type or n-type) and each diffused bit line has a second conductivity type opposite to the conductivity type of the silicon wafer. Additionally, the first electrically insulated conductive layer comprises polysilicon material and serves as a floating gate, and the second electrically insulated conductive layer comprises polysilicon material and serves as a word line and erasure gate. Further, the first predetermined channel area comprises a floating-gate channel area and the second predetermined channel area comprises a select-gate or word-line channel area. The floating-gate channel area is disposed between the first and second bit lines and the word-line channel area is disposed between the first bit line and the floating-gate channel area. The floating gate (first layer) has a first portion overlaying the second bit line and a second portion overlaying the floating-gate channel area. The word-line gate (second layer) has a first portion spaced from the substrate surface and overlaying the word-line channel area and a second portion overlaying the floating gate. The preferred embodiment further comprises programming means for selectively tunneling electrons onto the floating gate from the substrate, erasure means for removing electrons from the floating gate to the word line, and sense means for sensing the potential of the floating gate.

Also in a preferred embodiment of the present invention, the first portion of the first layer (floating gate) is capacitively coupled to the second substrate region (e.g., the second bit line of first embodiment). Additionally, a substantial amount of the potential applied to the second substrate region is coupled to the first layer (floating gate) by the capacitive coupling between the first portion of the first layer (floating gate) and the second substrate region. This coupling substantially modifies the potential on the first layer (floating gate) and greatly enhances the programmability and programming efficiency of the present invention, and various embodiments thereof, and allows lower potential differences to be used for programming. The lower potential differences allows operation from low-level supply potentials and reduces the memory cell area by allowing substrate isolation areas around the cell according to this feature of the present invention to be smaller. The present state of the art in EEPROM and EPROM memories teaches against this aspect of the present invention in that the capacitive coupling between the floating gate and the drain substrate region in state of the art EEPROM and EPROM devices is minimized, so that no substantial coupling occurs therebetween.

In a further embodiment, the present invention preferably includes a first spacing distance between the second portion of the first layer (floating gate) and the first substrate surface, and a second spacing distance between the first portion of the second layer (e.g., word line of first embodiment) and the first substrate surface. In this embodiment, the first spacing distance is preferably less than the second spacing distance. This difference in first and second spacing distances enhances the introduction and tunneling of electrons from the substrate channel areas to the first layer (floating gate) during programming. This enhancement allows the current and potential differences used in programming to be reduced, thereby allowing more efficient operation and smaller isolation areas, which in turn allows for a more compact memory cell.

The present invention may further comprise erasure means for selectively removing electrons from the first layer to the second layer, and the second layer of the present invention may be used as means for selecting the nonvolatile floating gate device of the present invention for erasure, programming, and sensing operations, particularly in the context of a memory array device. This second feature of the present invention allows the present invention and further embodiments thereof to be constructed in a compact manner as the second layer serves more than one function. In contrast, the prior EEPROM art teaches the use of a separate select gate and the EPROM art teaches the use of ultra-violet light exposure for erasure.

The above-described erasure means may further comprise the formation of one or more enhanced emission structures disposed on the surface of the first layer. Each emission structure comprises a rounded emitting surface having a radius of curvature which enables an enhancement of the local electric field near the rounded emitting surface. The enhanced emission structures reduce the applied voltage necessary for tunnelling of electrons from the first layer to the second layer so that the potential differences required for erasure may be substantially reduced. The reduction in erasure potential differences allows the use of lower voltages which can be generated and controlled "on-chip" (i.e., on the same substrate) and allows smaller isolation areas to be used and thereby makes for a more compact memory cell.

As a further embodiment of the present invention, a plurality of memory cells according to the present invention equal in number to a page of binary data may be arranged along a word line or row, the selection of the word line during an erasure operation thereby erasing a page of binary data and the selection of the word line during a programming operation thereby writing a page of binary data. Thus, the full-featured capabilities of a memory array according to the present invention is provided while maintaining a compact memory cell size. This feature also permits the erasure of just one word line or page of memory data instead of an entire sector or block of memory data, as is the case with EPROM devices and flash EPROM devices.

As a further embodiment of the present invention, a plurality of memory cells according to the present invention may be arranged in an array of word-line rows and bit-line columns having a virtual-ground array topology. The second substrate region of each memory cell may be coupled to a corresponding bit line and the second layer of each memory cell may be coupled to a corresponding word line. The first substrate region of the memory cell may be electrically coupled to the bit line of an adjacent memory cell to form a virtual ground array structure. The ability of the present invention to be incorporated into a virtual-ground array topology furthers the compact nature of a memory cell according to the present invention by eliminating the need for a dedicated grounding system.

It may be appreciated that the features of the above further embodiments of the present invention may be selectively combined with one another and with other features described below in practicing the present invention to provide a full-featured, compact memory cell according to the present invention.

Accordingly, it is an object of the present invention to provide a compact electrically-erasable and electrically-programmable nonvolatile memory cell which is more compact than prior art EEPROM non-volatile memory devices.

It is another object of the present invention to provide a compact electrically-erasable and electrically-programmable nonvolatile memory cell which is byte alterable and page alterable, in contrast to prior art EPROM and flash EPROM memory devices.

It is yet another object of the present invention to provide a programming means and method which significantly enhances the programming efficiency of the non-volatile memory device of the present invention, which furthers the provision of a more compact memory cell.

It is yet another object of the present invention to provide a full-featured non-volatile memory capable of operating from a single low-level input power supply, such as 5 volts.

It is still another object of the present invention to provide a compact memory cell that may be organized into pages which may be selectively erased and programmed.

It is yet another object of the present invention to provide a compact memory cell that may be incorporated into an array having a virtual ground topology, thereby providing an even more dense memory array.

These and other objects of the present invention will become apparent to those skilled in the art from the following detailed description of the invention and from the accompanying drawings.

BRIEF DESCRIPTION OF THE DRAWINGS

FIG. 1 is a schematic cross-sectional view of a non-volatile memory cell and array constructed according to the present invention;

FIG. 2 is a plan view of the memory cell and array of FIG. 1;

FIG. 3 is an approximate equivalent electrical circuit of the nonvolatile memory cell illustrated in FIGS. 1 and 2 during a read, programming, and erasure operations of the memory cell;

FIGS. 4A–4C are schematic cross-sectional views of various preferred embodiments of a non-volatile memory cell constructed according to the present invention; and FIG. 5 is a combined plan view and circuit diagram of a integrated circuit memory device according to the present invention.

DETAILED DESCRIPTION OF THE INVENTION

A portion of a first memory array embodiment of the compact page-erasable EEPROM nonvolatile memory devices according to the present invention is shown at 10 in FIG. 1. As discussed below in greater detail, memory array 10 comprises a plurality of memory cells 15, of which FIG. 1 shows three such memory cells 15 in a cross-section view along one word line of memory array 10. Memory array 10 comprises a substrate 12 having a first conductivity type and a first surface 13. In a preferred embodiment of the present invention, the conductivity type of substrate 12 is p-type. Memory array 10 further comprises a plurality of substrate regions 20, 22, and 24 disposed in first surface 13 of substrate 12, each substrate region having a second conductivity type opposite to the first conductivity type of substrate 12. In a preferred embodiment of the present invention, the conductivity type of the substrate regions 20, 22, and 24 is n-type. As discussed below in greater detail, substrate regions 20, 22, and 24 provide means for reading and writing information to the nonvolatile memory cells 15 of memory array 10 and comprise bit lines of memory array 10. In the preferred embodiments of the present invention and as shown in FIG. 1, the bit lines formed by substrate regions 20, 22, and 24 are arranged in virtual-ground bit-line topology. However, it may be appreciated that the present invention may be practiced with the substrate regions 20, 22, and 24 arranged in a conventional bit line topology with the addition of conventional ground lines. The above-mentioned virtual-ground bit-line topology is discussed in greater detail below.

Memory array 10 further comprises a plurality of first electrically-insulated conducting layers 30, 34, and 38 spaced from substrate surface 13. Additionally, first layers 30, 34, and 38 are each spaced and insulated from one another, and are also referred to herein as floating-gate layers 30, 34, and 38, respectively. As discussed below in greater detail, each of floating-gate layers 30, 34, and 38 corresponds to a separate nonvolatile memory cell in memory array 10, and each floating-gate layer serves to represent and retain information as a function of the charge stored thereon. In the preferred embodiments of the present invention, this information is preferably represented in binary digital form where charge levels above a predetermined level represent a first binary state and charge levels below the predetermined level represent a second binary state. However, it may be appreciated that the information stored on floating gate layers 30, 34, and 38 may be in analog, or continuous-type, form where the value of information is a monotonic function of the charge stored on the floating-gate layer.

Along with first layers 30, 34, and 38, memory array 10 further comprises a second electrically insulated conductive layer 40 which, as described below in greater detail, has the function of a word line as well as other functions. Second layer 40 overlays first surface 13 and each of first layers 30, 34, and 38. Second layer 40 is also electrically isolated from first surface 13 and each of first layers 30, 34, and 38. As described below in greater detail, second layer 40 functions to select the memory cells it overlays for reading, programming and erasure operations. Second layer 40 also functions as an erase electrode for those memory cells beneath layer 40.

As described below, memory array 10 preferably comprises additional second layers similar to second layer 40 and disposed parallel thereto. Such an additional second layer is shown at 45 in FIG. 2 and discussed below in greater detail. As with second layer 40, a plurality of memory cells are disposed underneath each additional second layer 45. The additional second layers 45 provide additional rows in memory array 10.

FIG. 2 shows a top-plan view of memory array 10. FIG. 2 uses the same reference numerals used in FIG. 1. In FIG. 2, each of the floating gate layers (first layers) are drawn with the following line notation: '-+-+-'; the substrate regions (bit lines) 20, 22, and 24 are drawn with solid vertical lines; and second layer 40 is drawn with broken vertical lines having the following line notation: '-X-X-'. FIG. 2 also shows another second layer (word line) 45 of memory array 10 which is similar in function to second layer 40 shown in FIG. 1. Second layer 45 is parallel to second layer 40 and overlays its own set of floating-gate layers. In the preferred embodiment of the memory array 10 of the present invention, word lines 40,45 are substantially perpendicular to substrate regions (bit lines) 20,22,24 in the top-plan view of FIG. 2. However, it may be appreciated that the practice of the present invention is not limited to having the word lines substantially perpendicular to the bit lines. For example, the word lines may be at a diagonal (i.e., askew) to the bit lines.

In FIG. 2, the width of each of layers 40 and 45 are somewhat expanded so as to more clearly show the boundary of the floating-gate layers 34. In a preferred embodiment of the present invention, the width of second layers 40 and 45 substantially coincide with the widths of the floating-gate layers 34 which they respectively overlay so that gated-conductive regions parallel to the lengths of the floating gates 34 are not formed in the substrate. Such parallel-conduction paths could potentially disturb the reading, programming, and erasure operations discussed below. In the alternative, however, it may be appreciated that isolation techniques such as field oxide may also be used to prevent the formation of such parallel-conduction paths and, consequently, that the width of second layers 40 and 45 may not have to substantially coincide with the widths of the floating-gate layers 34 which they respectively overlay.

In a preferred embodiment of the present invention, memory array 10 further comprises a plurality of isolation regions 16 as shown in FIG. 2 (dotted lines). Isolation regions 16 are disposed in the spaces between adjacent word lines (e.g., 40,45) which are bounded by adjacent bit lines (e.g., 20,22,24) to prevent unwanted communication between memory cells during reading, programming and erasing operations. In the preferred memory-array embodiment of the present invention, an isolation region is provided in each free space which is surrounded by two adjacent word lines and two adjacent bit lines. Further, each isolation region 16 preferably comprises a field oxide region, as formed by methods well known to the art such as "LOCOS" (LOCal Oxidation of Silicon), thick oxide, and trench, and preferably provides a channel-to-channel punchthrough voltage of at least approximately 8 V, under un-gated conditions. In a preferred embodiment of the present invention, the isolation regions 16 are formed by the "LOCOS" process. However, the present invention is not limited to using the "LOCOS" manufacturing process to form isolation regions 16 as other oxide formation processes known to the art, presently and in the future, may be used to provided an equivalent means of isolating the memory cells of the present invention. Additionally, the present invention is not limited to isolation regions 16 comprising field oxide regions as other isolation techniques, such as mesa isolation and oxygen implantation, known in the art as well as future isolation techniques may be used to practice the present invention to provide an equivalent means of isolation.

MEMORY CELL STRUCTURE

Having now generally described the structure of memory array 10, the structure and operation of an exemplary memory cell 15 within memory cell 10 and according to the present invention is described. As shown in FIGS. 1 and 2, one of the memory cells in array 10 is generally outlined by a box 15. Memory cell 15 includes the previously defined elements of substrate 12, first substrate region 20 and second substrate region 22. Each substrate region 20,22 is disposed in the substrate surface 13 of surface 12. Substrate region 20 serves as a ground line for memory cell 15 and substrate region 22 serves as a bit line for memory cell 15. As indicated by the division lines for memory cell 15, first substrate region 20 is shared between memory cell 15 and the memory cell adjacent and to the left of memory cell 15. Likewise, substrate region 22 is shared between memory cell 15 and the memory cell adjacent and to the right of memory cell 15. These two adjacent cells to cell 15 are referred to as the left-adjacent cell and the right-adjacent cell, respectively. In operation, substrate region 20 provides to the left-adjacent cell the functions that substrate region 22 provides for memory cell 15. Likewise, substrate region 22 provides to the right-adjacent cell the functions that substrate region 20 provides for memory cell 15. For example, and as described below in greater detail, substrate region 20 may selectively serve as ground line for memory cell 15 or as a bit line for the left-adjacent cell, depending on whether memory array 10 is operating on memory cell 15 or the left-adjacent cell, respectively. Likewise, and as an example, substrate region 22 may selectively serve as bit line for memory cell 15 or as a ground line for the right-adjacent cell, depending on whether memory array 10 is operating on memory cell 15 or the fight-adjacent cell, respectively.

The sharing of substrate regions 20 and 22 between memory cells of memory array 10 is a feature of the "virtual-ground array" topology, which is discussed below in greater detail. The sharing of substrate regions in the above described manner, aids in reducing the area of memory cell 15 but is not essential for the practicing of the present invention. It may be appreciated that the present invention may be practiced with a conventional-ground array topology where additional substrate regions are added to couple in a "true" ground reference. However, it may be appreciated that the ability of the present invention to use the above-described virtual-ground array topology may significantly increase the compact nature of memory array devices according to the present invention.

Memory cell 15 further comprises first electrically insulated conductive layer 34 spaced from the substrate surface 13. First layer 34 has a first portion 35 capacitively coupled to second substrate region 22 and a second portion 37 overlaying a first predetermined channel 51 of substrate surface 13, which is disposed between first substrate region 20 and second substrate region 22. First layer 34 serves to store information in the form of electronic charge stored thereon in varying amounts and is referred to as a floating gate. As such, first layer 34 is also referred to as floating gate layer 34 or floating gate 34 herein. The storage of electrons on the floating gate layer 34 in varying amounts provides a means for storing binary digital information. For example, a charge level above a predetermined level may be used to represent a first binary state whereas a charge level below the predetermined level may be used to represent a second binary state. In a preferred embodiment of the present invention, memory cell 15 stores binary digital information in the form of charge levels above and below a predetermined charge level. However, it may be appreciated that the memory cell of the present invention may be used to store analog information having a continuum of values corresponding to a continuum of charge levels on floating gate layer 34.

Memory cell 15 further comprises second electrically insulated conductive layer 40 having a first portion 41 spaced from substrate surface 13 and overlaying a second predetermined channel area 52 of substrate surface 13. First portion 41 of second layer 40 is disposed generally intermediate first substrate region 20 and second portion 37 of the floating gate layer 34, as shown in FIG. 1. Second layer 40 further has a second portion 43 overlaying floating gate layer 34, floating gate layer 34 preferable having a small capacitive coupling to the second layer 40. In a preferred embodiment of the present invention, second layer 40 serves as a word-select line for selecting memory cell 15 (i.e., means for selecting cell 15), as well as other memory cells underlying second layer 40, for reading and programming. Additionally, second layer 40 serves as a combined select line and erase line for memory cell 15, as well as for other memory cells underlying second layer 40. The combined functions of second layer 40 greatly reduce the physical size of memory cell 15 over that of convention EEPROM/EPROM cells by eliminating the need for dedicated erasure, select, and control lines, as discussed below with reference to the reading, programming and erasure operations.

As mentioned above, floating gate layers 30, 34, and 38 are spaced and insulated from substrate surface 13 and from second layer 40. This spacing is provided by a dielectric shown at 50 in FIG. 1. As also mentioned above, the first portions of second layer 40 are spaced from substrate surface 13, which is also provided by dielectric 50. In a preferred embodiment of the present invention, dielectric 50 comprises silicon dioxide ($SiO_2$) for the dielectric insolation between substrate surface 13 and first layers 30, 34, and 38, between first layers 30, 34, 38 and second layer 40, and between substrate surface 13 and second layer 40. However, it may be appreciated that the present invention is not limited to the use of silicon dioxide as the insulating material between these layers and that other dielectric insulators, such as silicon nitride or a layer combination of oxide-nitride-oxide, known to the art or to be developed in the future, can provide an equivalent function.

Shown along with memory cell 15 in FIG. 1 are a set of symbol notations for indicating the application of voltages to selected electrodes of memory array 10. The notation $V_{B0}$ is for representing the voltages applied to substrate region 20, the notation $V_{B1}$ is for representing the voltages applied to substrate region 22, the notation $V_{B2}$ is for representing the voltages applied to substrate region 24, and the notation $V_{W1}$ is for representing the voltages applied to second layer 40. Also shown along with memory cell 15 in FIG. 1 are an X-direction 60 in the plane of the cross-section shown in FIG. 1, a vertical plane 70, and a right edge 23 of substrate region 22. As discussed below in greater detail, direction 60, plane 70, and edge 23 are used in describing further preferred embodiments of the present invention. In one such further embodiment, floating gate layer 34 overlies substantially all of substrate region 22 in the direction defined by X-direction 60. In another such further embodiment, right edge 23 of substrate region 22 substantially coincides with a side face 36 of floating gate layer 34 in plane 70.

The compact nature and full-featured capability of the present invention will become clear from the following features, which may be used alone or in combination with one another in practicing various preferred embodiments of the present invention.

As one preferred embodiment, the present invention may include an improved programming means for selectively tunneling electrons onto the floating gate 34 from substrate 12. The improved programming means comprises a first means for selectively applying potential to first substrate region 20 and a second means for selectively applying potential to second substrate region 22. The first portion 35 of floating gate 34 and substrate region 22 are further arranged such that a capacitive coupling exists therebetween which enables the coupling of a substantial amount of the potential applied to second substrate region 22 to the floating gate 34. This potential coupling substantially modifies the potential on the floating gate 34 during programming. Preferably, at least approximately 25 percent of the potential applied to second substrate region 22 is coupled to floating gate layer 34 during programming. In further preferred embodiments, as discussed below in greater detail, approximately 50 percent to approximately 80 percent of the potential applied to second substrate region 22 is coupled to floating gate layer 34 during programming.

The above-described capacitive coupling is substantially larger than that taught in the EEPROM and EPROM arts and is, in fact, taught against by the EPROM art. As discussed below in greater detail, the substantial coupling provided by the capacitive relationship between substrate region 22 and floating gate 34 serves to steer the floating gate during programming and enhances the programmability and programming efficiency of the present invention. As discussed below in greater detail, the electrons tunneled into floating gate 34 by this capacitive coupling during programming of memory cell 15 are generated in channel areas 51 and 52 as hot-electrons with sufficient energy to tunnel through dielectric 50 to gate 34. In general, only a fraction of the hot-electrons generated in areas 51 and 52 are directed into the dielectric towards floating gate 34. The electric field between floating gate 34 and areas 51 and 52 is significantly increase by the voltage coupled to floating gate 34 from substrate region 22 by this capacitive coupling. This increases the fraction of hot-electrons directed towards and tunneled onto floating gate 34 and results in the greater tunneling efficiency. As such, the amount of hot-electrons generated in areas 51 and 52 may be reduced because of this increased efficiency. As the amount of hot-electrons generated in areas 51 and 52 is a function of the current density and potential difference between regions 20 and 22, the greater efficiency allows the use of lower potential differences and current densities between substrate regions 20 and 22 during programming. In turn, the lower current and voltage levels allow operation from lower-level supply potentials, and enables the amount of isolation needed to prevent electrical "punch-through" between memory cells to be lessened. This latter benefit also allows for the reduction of area required for memory cell 15, leading to a more compact cell.

Additionally, this coupling feature of this embodiment of the present invention allows a substantial portion of substrate region 22 (or all of region 22) along X-direction 60 to be disposed underneath floating gate layer 34. This significantly reduces the length of memory cell 15, thus making the memory cell 15 more compact. In contrast, the EEPROM and EPROM memory arts teach that a floating gate, such as layer 34, should be self-aligned to the source and drain n+ diffusion regions, such as regions 20 and 22, and that the capacitive coupling between the floating gate and the drain substrate region should be minimized such that there is no substantial voltage coupling therebetween.

It should be appreciated that the above-mentioned capacitive coupling between region 22 and floating gate 34 may be achieved by having a predetermined relationship for the capacitances between floating gate 34, substrate region 22, second layer 40, and substrate 12. Specifically, as shown in FIGS. 1 and 3, there is a first capacitance $C_1$ between floating gate 34 and second layer 40, a second capacitance $C_2$ between floating gate 34 and substrate channel area 51, and a third capacitance $C_3$ between floating gate 34 and second substrate region 22. (There are additional capacitances, such as between second layer 34 and substrate region 22, but they do not substantially impact on the above coupling in the manner described below.) The first and third capacitances are substantially fixed in value and may be calculated by techniques and methods well known in the art (e.g., parallel-plate approximation of C=AREA×Dielectric Constant divided by dielectric thickness; C may also be determined by computer simulation.) The second capacitance $C_2$ between floating gate 34 and area 51 is variable in nature, depending on whether an inversion channel or a depletion zone is formed in area 51. As discussed below, the second capacitance may vary by ±30% or more from a center value.

As one way of ensuring that at least 25 percent of the voltage of substrate region 22 is coupled to floating gate 34 during programming in this embodiment of the present invention, the third capacitance $C_3$ between gate 34 and region 22 may be set to approximately 25 percent or more of the total capacitive coupling to floating gate 34 from surrounding conductive elements. (The principle for this is based on a formula for coupling voltages to a floating gate from one or more electrodes. The principle is well known in the floating gate device art and a mathematical basis therefor is derived below with reference to a more detailed discussion of programming for a further embodiment of the present invention.) In this case, the principal surrounding electrodes comprise second layer 40, substrate area 51, and substrate region 22 and the total capacitance would comprise $C_1+C_2+C_3$. Thus, having $C_3$ be at least 25 percent of the sum $C_1+C_2+C_3$ would be one way of achieving at least a 25 percent coupling of the potential of region 22 to the floating gate.

As mentioned above, the second capacitance is variable in nature, which would appear to make it difficult to design the structure for this embodiment to have a third capacitance equal to or greater than 25 percent of the total sum of the above first, second, and third capacitances. However, as described below in greater detail, the second capacitance is substantially coupled in parallel with the third capacitance during much of the programming operation, and is typically smaller than the third capacitance. As such, the structure of memory cell 15 for this embodiment could be designed to meet the above criterion by neglecting the contribution of the second capacitance and by setting the third capacitance to be 25 percent or more of the sum of the first and third capacitances: $C_3/(C_1+C_3) \geq 0.25$. As such, the value of the third capacitance would be equal to or greater than one-third of the first capacitance. As the second capacitance adds in parallel with the third capacitance, the coupling percentage would increase as $C_2$ is added to both numerator and denominator: $(C_3+C_2)/(C_1+C_3+C_2) \geq 0.25$. In one preferred embodiment of the present invention, the value of $C_3$ is set to be greater than the value of $C_1$ to provide a ratio $(C_3)/(C_1+C_3) \geq 0.50$, and in another preferred embodiment the value of $C_3$ is set to be greater than twice the value of $C_1$ to provide a ratio $(C_3)/(C_1+C_3) \geq 0.67$. In a further embodiment detailed below, the value of $C_3$ is set to be slightly more than three times the value of $C_1$ to provide a ratio $(C_3)/(C_1+C_3) \geq 0.75$.

With regard to this and other embodiments of the present invention, it should be appreciated that the EPROM prior art teaches against these embodiments since it teaches maximizing the capacitance $C_1$, which corresponds to the capacitance between the control line and the EPROM floating gate, and the minimizing of the capacitance $C_3$, which corresponds to the capacitance between the EPROM floating gate and the EPROM drain. Typically, the corresponding $C_1$ capacitance in an EPROM device is ten times larger than the corresponding $C_3$ capacitance in an EPROM device, giving a ratio of $(C_3)/(C_1+C_3)=0.09$. Furthermore, the EPROM art teaches that the control gate steers the floating gate rather than the drain region, as is done by substrate region 22 in this embodiment of the present invention.

Before turning to further embodiments of the present invention, the variable nature of the second capacitance and the tracking of capacitance $C_2$ with capacitance $C_3$ are briefly discussed. As mentioned above, the second capacitance $C_2$ from floating gate 34 to area 51 is variable in nature, depending on whether an inversion channel or a depletion zone is formed in area 51. As is well known in the semiconductor device art, an inversion channel is formed in area 51 when the voltage of floating gate 34 is substantially positive with respect to area 51, i.e., substantially more than one threshold voltage above the potential of area 51. The inversion channel acts substantially like a conductive plate and the second capacitance may be calculated according to a parallel-plate capacitor model, as described above. When the channel area 51 is inverted, the second capacitance attains its maximum value. As the voltage of the floating gate decreases with respect to the voltage of area 51, the channel becomes depleted and the second capacitance decreases to a minimum, which is approximately 40 percent of its maximum value. As also mentioned above, the second capacitance $C_2$ adds with the third capacitance $C_3$ during most of the programming operation. This is because there is a substantially continuous inversion layer from the boundary 54 of area 51 to substrate region 22 during programming and, consequently, the potential distribution in area 51 substantially tracks the potential of region 22. Thus, the voltage of area 51 follows the voltage of region 22 and the second and third capacitances add together, as they are referenced to a common electrode: floating gate 34.

Having thus described the nature of the second capacitance $C_2$, the discussion now turns to further aspects of the present invention which contribute to the compact nature and full-featured capability of the present invention. The features of the following embodiments may be combined with the above-described embodiment or others in practicing the present invention.

In one aspect of the present invention, the programming means includes providing a first spacing distance (i.e., thickness) between second portion 37 of floating gate (first layer) 34 and the first channel area 51 (substrate surface 13), and a second spacing distance between first portion 41 of second layer 40 and second channel area 52 (substrate surface 13). Preferably, the first spacing distance is less than the second spacing distance. As discussed below in greater detail, the step in spacing distances over channel areas 51 and 52 generates an electric field into floating gate 34 from area 52. This electric field aids the introduction of electrons during the programming process and, therefore, allows lower programming currents and voltages to be used. This, in turn, makes it feasible for an on-chip generator to provide the programming voltages (due to the lower programming current) and for a more compact cell, since the voltage reduction allows for smaller isolation regions, as indicated above. The nature of the electric field enhancement is discussed below in greater detail after the nature of the hot-electron programming mechanism is discussed.

A preferred embodiment of the present invention further comprises erasure means for selectively removing electrons from floating gate layer 34 to the second layer 40. As described below in greater detail, a high voltage (e.g., ~20 V) is applied to second layer 40 while substrate regions 20 and 22 are grounded during the erasure operation. Preferably, second layer 40 provides means for selecting memory cell 15 for erasure by the selective application of the high voltage to second layer 40. Thus, second layer 40 may also be used to select memory cell 15 for erasure operations as well as for programming and reading operations, as indicated above. The features of this embodiment allows the present invention to be constructed in a compact manner since the second layer serves more than one function.

It may be appreciated that any of the above described embodiments of the present invention may be used to represent binary data information in the form of two charge levels, as for example in a digital memory device, or may be used to represent analog data information in the form of continuous charge levels, as in an analog memory circuit. Additionally and as discussed below in greater detail, it may be appreciated that the binary information may be represented as a first state having a first charge level set by the programming means of the present invention and second state having a second charge level set by the erasure means of the present invention. However, it may be appreciated that the binary states may have corresponding charge levels which are both set by the programming means after an erasure of the memory device. In this case, the programming means would tunnel two separate levels of charge to represent the two digital states.

It may also be appreciated that the above features of these embodiments of the present invention may be used alone or in combination in practicing further embodiments of the present invention, described below.

Having described the general structure of memory cell 15, the physical dimensions and characteristics of a preferred structural embodiment of memory cell 15 are now given with reference to FIG. 2. Note that isolation regions 16 preferably comprises LOCOS isolation structures and 1.0 micron lithography line widths are used. In this preferred embodiment, the dimensions of memory cell 15 are approximately 3.0 microns long (in the direction of second layer 40 in FIG. 2) by 5.0 microns wide (in the direction perpendicular to second layer 40 in FIG. 2). Approximately 3.0 microns of the width in this preferred embodiment is used by isolation regions 16 to isolate memory cell 15 form neighbor memory cells. In this preferred embodiment of memory cell 15, the width of substrate regions 20, 22, 24 (i.e., the narrowest dimension of these substrate regions in FIG. 2) is approximately 1.0 micron. Additionally, the dimensions of floating gate layer 34 are approximately 1.3 microns wide by approximately 1.7 microns long, the long dimension being in the same direction of word line (second layer) 40. The width of second layer 40 is approximately 1.3 microns. The overall area of this preferred embodiment of memory cell 15 is approximately 15.0 square microns, which is approximately one-half the area that is currently required for forming state of the art, full-featured floating-gate EEPROM devices.

It may be appreciated that the dimensions of region 16 may be smaller when trench isolation or self-aligned deposited isolation processes are used for forming regions 16 than when a LOCOS isolation process is used. With these alternate isolation processes, it is believed that the width of the isolation regions may be reduced from approximately 3.0 microns to approximately 1.0 micron, and the corresponding width of memory cell 15 may be reduced from approximately 5.0 microns to approximately 2.3 microns. The overall cell area would then be approximately 7.0 square microns, which is approximately one fourth the area now required for forming state of the art, full-featured floating-gate EEPROM devices.

Although specific numerical dimensions have been given in this preferred embodiment, it may be appreciated that these dimensions may be scaled with respect to one another as taught in the art to either increase or decrease the physical size of memory cell 15. Such scaling may occur, for example, when the minimum lithographic dimension is varied or to accommodate the addition of metal-strapping lines for the bit lines (substrate regions 20, 22, 24) or for the word lines (second layers 40, 45). (A metal-strapping line is a top metal line which runs parallel to and above a corresponding bit line or word line and is periodically connected, i.e., strapped, to its corresponding bit or word line. The metal-strapping line serves to reduce the resistance of the bit or word line, which is often made from higher resistive materials, such as substrate diffusion and polysilicon, than the strapping metal.) Such an example of metal-strapping is discussed below as a further embodiment of the memory array and memory cell according to the present invention.

With reference to FIG. 1, the composition and dimensions of various layers for the above preferred embodiment are now discussed. In this preferred embodiment, first layers 30, 34, 38 and second layers 40, 45 each comprise a semiconductive polysilicon material having a layer thickness of approximately 250 nanometers to 400 nanometers. First layers 30, 34, and 38 are spaced from substrate surface 13 by approximately 20 nanometers. First portion 41 of second layer 40 is spaced from substrate surface 13 by approximately 40 nanometers and second portion 43 of second layer 40 is spaced from the top surface of floating gate layer 34 by approximately 170 nanometers. The shortest distance between the outermost tip of corner 39 and second portion 43 of second layer 40 is approximately 50 nanometers. In this preferred embodiment, substrate regions 20, 22, and 24 are diffused into substrate 12 from surface 13 to a depth of approximately 300 nanometers or less and preferably have a sheet resistivity of approximately 10–50 ohms per square. Additionally, predetermined channel areas 51 and 52 are implanted with respective threshold-adjustment implants such that their threshold voltages (i.e., MOS-device $V_T$'S) are approximately 3 volts and 1 volt, respectively. (A conductivity threshold of 3 volts for area 51 means that the conductivity type of area 51 changes from its intrinsic first conductivity type to the second conductivity type when the voltage of floating-gate layer 34 is more than 3 volts greater than the voltage of area 51. (Channel area 51 increases in conductivity of the second type as the voltage difference between layer 34 and area 51 increases beyond 3 volts.) It is believed that the ~3 V threshold implant for area 51 increases the endurance of the device by centering the "programming" window to achieve the maximum cell endurance (i.e., maximum number of program/erase cycles). It is further believed that the threshold implant for area 51 may be between approximately 2 V and approximately 4 V depending upon specific properties of the dielectric (oxide) and the specific structural dimensions.

PROGRAMMING, ERASING, AND READING OPERATIONS

Having now generally described the structure and features of memory cell 15 and the dimensions and characteristics of a preferred structural embodiment of memory cell 15, the programming, reading, and erasing operations performed on memory cell 15 according to the present invention are now described. In the following discussion, the preferred mechanisms for performing these operations are generally described. Then, an approximate equivalent electrical circuit model is introduced as an aid in understanding these operations, particularly in the context of practicing the invention in a memory array. Finally, a detailed discussion of the programming, erasure, and reading operations is provided with reference to the above-described preferred structural embodiment of memory cell 15, the generally described mechanisms, and the introduced electrical circuit model.

As indicated above, the representation of information in memory cell 15 is in the form of storing electrons on a floating gate conductor. The floating gate, when referenced to the substrate voltage or the voltage of another reference conductor, will have a voltage as a function of the charge disposed on the floating gate. For a simple exemplary two-conductor system, such as a single floating gate and a single external conductor, the floating gate voltage $V_{FG}$ with respect to the external conductor voltage $V_{EXT}$ is a function of the net electronic charge $Q_{FG}$ on the floating gate divided by the capacitance C between the two electrodes: $V_{FG}=Q_{FG}/C+V_{EXT}$, as determined from the well-known electrostatics formula Q=CV. For more than one external conductor such as n external conductors, the relationship is more complicated and is given by:

$$V_{FG} = \frac{Q_{FG} + \sum_{i=1}^{i=n} C_i V_i}{\sum_{i=1}^{i=n} C_i} \quad (1)$$

where the index i represents the external conductors, $V_i$ represents the voltage of the $i^{th}$ external conductor with respect to a common ground, and $C_i$ represents the capacitance between the $i^{th}$ external conductor and the floating gate. The floating gate voltage $V_{FG}$ and the voltages $V_i$ are referenced to a common reference potential, such as ground. Equation 1 may be further simplified to:

$$V_{FG} = \frac{Q_{FG}}{C_T} + \sum_{i=1}^{i=n} \frac{C_i}{C_T} V_i \quad (2)$$

where $C_T$ represents the summation of the capacitances Ci. In turn, equation 2 may be further simplified by noting that the first term $Q_{FG}/C_T$ has the units of voltage and, in the absence of external voltages $V_i$, represent the quiescent-ground state voltage on the floating gate $V_{FG}^O$, and by further noting that each $C_i/C_T$ can be replaced by a corresponding constant coupling ratio $R_i$, which ranges in value between 0 and 1:

$$V_{FG} = V_{FG}^0 + \sum_{i=1}^{i=n} R_i V_i \quad (3)$$

The voltages in equation 3 are, for ease of discussion, referenced to a common ground potential of zero volts. For the floating gate layer 34 of memory cell 15, there are primarily three such $R_i$ coupling coefficients: $R_1$ for the capacitive coupling between floating gate layer 34 and second layer 40, $R_2$ for the capacitive coupling between layer 34 and substrate channel area 51, and $R_3$ for the capacitive coupling between layer 34 and substrate region 22. The coupling coefficients $R_1$, $R_2$, and $R_3$ correspond to the capacitances $C_1$, $C_2$, and $C_3$, respectively, discussed above with reference to the capacitive-coupling embodiment of the present invention. For the preferred structural embodiment of memory cell 15 with the above-given structural parameters, typical values for each of these coefficients is as follows: $R_1 \approx 0.2$, $R_2 \approx 0.2$, and $R_3 \approx 0.6$, and a typical value for the total capacitance $C_T$ is 5 femto-Farads ($10^{-15}$ Farads). As can be seen, the capacitive coupling to second substrate region 22 ($R_3$) is greater than that to the capacitive coupling to second layer 40 ($R_1$), which is in accordance to the above-described capacitive-coupling embodiment of the present invention. As with capacitance $C_2$, ratio coefficient $R_2$ is variable in nature since $C_2$ is variable. The value of 0.2 is the maximum value for this ratio corresponding to when an inversion layer is formed in area 51, and is valid during much of the programming, reading, and erasing operations. $R_2$ has a minimum value of approximately 0.09, as when a depletion zone is formed in area 51. For the purposes of discussing this embodiment of the present invention, a value of 0.2 is used. Equation 3 and these coefficients are used below in the detailed discussions on programming and erasure operations.

Since the floating gate is electrically isolated by dielectric material as indicated in the above structure discussion, its voltage must be detected by indirect means. In a preferred embodiment of the present invention, a portion of the floating-gate layer 34 is disposed over and in close proximity to a predetermined area of the substrate to form a channel region in the substrate. The conductivity of this area is modulated as a function of the floating gate's voltage, and in turn, the charge state of the floating gate. In the embodiment of the present invention shown in FIG. 1, this area is shown as first predetermined channel area 51. The conductivity modulation may be detected by applying an external sense voltage across the channel to determine the conductivity based on the amount of sense current that flows in response to the sense voltage. In the embodiment of the present invention shown in FIG. 1, the sense voltage is applied between substrate regions 20 and 22, as described in greater detail below. In an embodiment of the present invention in which binary digital information is stored, the floating gate layer 34 of memory cell 15 stores binary digital information in the form of two discrete charge. These charge levels are preferably chosen to provide a wide difference between conductivity states of the above-mentioned substrate area, such as area 51 in FIG. 1. In a preferred embodiment of the present invention, one charge level provides substantially zero conductivity while the other charge level provides a significant amount of conductivity which can be detected by current sensing circuits. However, it may be appreciated that digital information can be effectively stored by having two charge levels which both provide non-zero levels of conductivity and which are measurably distinct.

During the above conductivity sensing operations, predetermined channel area 52, which is adjacent to channel area 51, is placed in a conductive state by second layer 40 so that the conductivity state of area 51 may be measured. In this way, second layer 40 comprises means for selecting memory cell 15 for reading (as well as programming) operations. Further details on sensing the conductivity state of area 51 and on reading information from memory cell 15 are provided below.

To change the net charge on the floating gate layer 34, electrons are introduced onto the floating gate to lower the net charge level (electrons have a negative charge) and are removed from the floating gate to increase the net charge level. In general, electrons are introduced onto the floating gate to lower the net charge level from a positive value to a less positive or to a negative value, and electrons are removed from the floating gate to raise the net charge level from a negative value to a less negative or to a positive value. The process of introducing electrons is called "programming" and the process of removing electrons is called "erasing" or "erasure". In the present invention, electrons are introduced onto the floating gate layer from the substrate regions by hot electrons being generated in the channel region and subsequently directed into the floating gate through the dielectric spacing layer 50 between the floating gate and the substrate. This process is termed hot-electron programming (HEP) and the memory devices according to the present invention are referred to as HEP-EEPROMs. Electrons are removed from the floating gate layer 34 by tunneling of electrons from the floating gate layer to an auxiliary conductor, such as second layer 40. This process is known as Fowler-Nordheim tunneling. The hot-electron tunneling and the Fowler-Nordheim tunneling mechanisms, as they are employed in the present invention, are discussed below in greater detail.

To generate hot-electrons to be tunneled onto floating gate (first) layer 34, a potential difference is applied between substrate regions 20 and 22, with region 22 being more positive, and a current is caused to flow. Second layer 40 is set to a potential with respect to substrate region 20 which causes second predetermined channel area 52 to change its conductivity so that electrons may flow from substrate region 20 towards substrate region 22 through channel area 52. In this way, second layer 40 comprises means for selecting memory cell 15 for programming operations. In a preferred embodiment of memory cell 15, the conductivity type of area 52 is initially set to p-type (i.e., via the substrate doping), which substantially prevents the conduction of electrons through channel area 52. However, as well known in the semiconductor device arts, the effective conductivity type of area 52 may be modulated to n-type by the placement of second layer 40 (first portion 41) over channel area 52 and the application of a positive voltage greater than a predetermined threshold value, of for example 1 V, to second layer 40. The conductivity type may be changed back to p-type by the application of a voltage less than the predetermined threshold value. As well known to the semiconductor art, the predetermined threshold value may be adjusted by changing the thickness of the dielectric space between channel area 52 and first portion 41 of second layer 40 or by introducing a threshold implant as discussed above.

Also during programming operations, the potential on floating gate layer 34 with respect to substrate region 20 is such that channel area 51 is caused to change its conductivity so that electrons may flow from channel area 52 to substrate region 22. (As discussed below in greater detail, the boundary between channel areas 51 and 52 is indicated by reference numeral 54 in FIG. 1.) In a preferred embodiment of memory cell 15, the conductivity type of channel area 51, like channel area 52, is initially set to p-type (i.e., via the substrate doping), which substantially prevents the conduction of electrons through channel area 51. However, as for area channel 52, the effective conductivity type of channel area 51 may be modulated to n-type by the placement of floating-gate layer 34 (second portion 37) over area 51 and the application of a positive voltage greater than a second predetermined threshold value between floating gate 34 and channel area 51. During programming, the potential on floating gate layer 34 is sufficiently above the second predetermined threshold so as to invert the conductivity type of area 51. Typically, the charge on floating-gate layer 34 in the preferred embodiments is initially set by a preceding erase operation such that voltage on the floating-gate layer 34 at the beginning of a program operation is at a positive value of approximately 7 V to 10 V, as discussed below in greater detail.

With the conductivity type of channel areas 51 and 52 changed to allow electrons to flow from substrate regions 20 and 22, a sufficient voltage is applied across regions 20 and 22 to create a high-electric field region at a point in substrate 12 between regions 20 and 22, the point being located in portions of either or both of channel areas 51 and 52. In this high-electric field region, some electrons are accelerated to sufficient speed, direction, and energy to tunnel into second portion 37 of floating-gate layer 34 as hot electrons. To date, many details of a complete theoretical explanation of the hot-electron tunneling process are still unknown to the semiconductor device art (e.g., the exact point of tunneling and the minimum speed, energy and direction requirements). However, the effects and uses of the channel hot-electron tunneling mechanism have been well demonstrated empirically in EPROMs for over 20 years.

Without limiting the invention to any particular theoretical explanation or model, it is theorized that the hot electrons are generated in a channel "pinch-off" region located near the boundary 54 between channel areas 51 and 52. It is further theorized that there is a large electric field in the pinch-off region which accelerates the hot electrons, the large electric field being directed from region 22 to region 20 and being parallel to substrate surface 13. As known to the general electronics arts, electrons generally flow opposite to the direction of the local electric field. The large electric field is often characterized as being tangential since it is oriented parallel to substrate surface 13. It is further theorized that an avalanche breakdown process may occur in or near the pinch-off region to multiply the number of hot electrons. Normally, the hot-electrons would flow in a direction co-linear with the direction of the large tangential electric field. However, in and around the pinch-off region, it is theorized that the hot-electrons interact with the semiconductor lattice structure in what are known in the solid-state physics art as "scattering events", of which there are many types. As a consequence, the flow directions of the hot-electrons are altered away from the above-described co-linear direction into a broad distribution of directions. As a result, many of the electrons are directed towards substrate surface 13 and towards floating-gate layer 34. It is further theorized that the hot-electrons have wide distributions of energy and direction and that some hot-electrons have sufficient energy and direction, or a sufficient combination thereof, to tunnel through the dielectric space 50 to the floating-gate layer 34.

It is further believed that the location of the pinch-off region is a function of the applied potentials to substrate regions 20, 22 and to layers 34,40. Detailing the complete parametric relationship between the location and size of the pinch-off region and these applied potentials is beyond the scope of this document and is not necessary for practicing and understanding the present invention. However, the following qualitative relationships between the applied potentials and the location of the pinch-off region are given for the above described structural values of memory cell 15. It is believed that the pinch-off region is generally located in boundary 54 and extends into approximately the latter third portion of channel area 52 which is next to boundary 54 for the following starting set of bias voltages: ~0 V on substrate regions 20, ~8 V or more on substrate region 22 (bit line), ~1.5 V on second layer 40 (word line), and ~12 V on floating-gate layer 34 (first layer). Slight variations from these starting set values, on the order of 1 to 2 volt excursions, are qualitatively given. The voltage on substrate region 20 is taken as a reference and, therefore, the variation in the size and location of the pinch-off region with respect to the voltage on region 20 is not discussed. As the voltage on substrate region 22 increases from its above starting value, the left end of the pinch-off region moves towards substrate region 20 and the right end of the pinch-off region moves slightly towards channel area 51. As the voltage on substrate region 22 decreases, the left and right ends of the pinch-off region move towards one another. As the voltage on second layer 40 increases from its above starting value, the left end of the pinch-off regions moves towards boundary 54 and it is believed that the right end moves towards channel area 51. As the voltage on second layer 40 decreases, the left end of the pinch-off region moves towards region 20 and it is believed that the right end of the pinch-off region moves towards area 52. Finally, as the voltage on floating gate layer 34 increases, the pinch-off region moves towards region 20. As the voltage on floating gate layer 34 decreases, the pinch-off region moves towards region 22.

It is also believed that a second and separate pinch-off region may form in predetermined channel area 51 near substrate region 22 under some bias conditions. It is believed that this may occur near the completion of the programming operation and that it may also generate hot-electrons which may be tunneled onto floating-gate layer 34, and thereby contribute to the programming of layer 34.

The programming mechanisms that are believed to be used by the present invention in tunneling electrons to floating gate 34 have thus far been described. Additional features are now described which comprise further means for enhancing the above-described programming mechanisms. Specifically, the features described below are designed to enhance the generation of hot-electrons as well as the directing of hot-electrons from substrate 12 into floating gate layer 34, and thereby to improve the efficiency of cell programming. The first enhancing means, which has been described above, comprises means for modifying the voltage of floating-gate layer 34 by coupling voltage from substrate region 22 to layer 34 via the capacitive coupling between region 22 and layer 34. This may be accomplished by increasing the capacitive coupling between region 22 and layer 34, as previously described or by increasing the potential of region 22, as in a further embodiment. A positive voltage (with respect to substrate region 20) applied to substrate region 22 raises the potential of floating-gate layer 34 to enhance the direction of electrons into layer 34 and thereby also increases the efficiency of the programming operation.

It is believed that the enhancement in efficiency as a result of coupling potential to floating gate 34 from substrate region 22 occurs from the following effects. First, it is believed that the coupling of more positive potential to the floating gate layer 34 increases the n-type conductivity (i.e., inversion layer) of channel area 51 such that less potential voltage is "dropped" across area 51. This allows more of the potential applied between regions 20 and 22 to be "dropped" across the pinch-off region to enhance the generation hot-electrons and the energy levels of the hot-electrons. Second, it is believed that the additional positive potential creates an additional electric field directed from second portion 37 of floating-gate layer 34 to area 51 which aids the tunneling of electrons into layer 34 (again, electrons flow, or tend to flow, opposite to the direction of the local electric field). The additional electric field is believed to be substantially perpendicular to substrate surface 13.

The capacitive coupling between floating gate layer 34 and second substrate region 22 may be enhanced as follows. In one preferred embodiment, first portion 35 of floating gate layer 34 overlays a substantial portion of second substrate region 22 in the direction indicated by X-direction 60. This provides a greater surface area over which capacitive coupling between floating gate 34 and substrate region 22 may occur. Direction 60 is defined by the physical position of second substrate region 22 in relation to first substrate region 20, with X-direction 60 being directed from first substrate region 20 to second substrate region 22 along the length of memory cell 15. In those embodiments of the present invention where the bit lines (20,22,24) are substantially parallel to one another and orthogonal to the word lines (40,45), X-direction 60 is the direction of the shortest distance from region 20 to region 22.

More specifically, first portion 35 of floating gate layer 34 preferably overlays substantially all of second substrate region 22 in a cross-sectional plane perpendicular to first surface 13 of substrate 12, as shown by the cross-sectional plane along word line 40 in FIG. 1. In this embodiment, second substrate region 22 includes a first perimeter right edge 23, as shown in FIG. 1, with second substrate region 22 being disposed between its first perimeter edge 23 and first substrate region 20. The surface of first perimeter edge 23 defines a first plane 70 which is perpendicular to substrate 12 and passes through first perimeter edge 23. In other words, plane 70 is perpendicular to substrate surface 13 and coincides with, or comprises, first perimeter edge 23. In this embodiment, first portion 35 of floating gate layer 34 and second substrate region 22 are disposed substantially on the same side of first plane 70, as for example the left side of plane 70 shown in FIG. 1. Described in another way, first portion 35 of floating gate layer 34 is disposed substantially between first substrate region 20 and first plane 70.

Note that it is not essential that the overlapping be complete, as side face 36 may be spaced from first plane 70 by a predetermined distance such that second substrate region 22 underlaps first portion 35 of layer 34 by this predetermined distance in a direction perpendicular to first perimeter edge 23 (also plane 70). The overlap may also be taken to the point where the outermost perimeter edges of floating gate layer 34 and substrate region 22 substantially coincide. In such an embodiment, floating gate layer 34 comprises a perimeter side face 36, as shown in FIG. 1, which substantially coincides with first plane 70, to provide a maximum amount of overlap between portion 35 and region 22 in the direction of X-direction 60. This is explicitly shown in an embodiment of memory cell 15 shown as 15a in FIG. 4A.

As briefly discussed above, the thickness between channel area 51 and second portion 37 of floating-gate 34 may be set to a different value, preferably less, than the thickness between channel area 52 and first portion 41 of second layer 40 to enhance the hot-electron tunneling current. As exemplary values, the first spacing distance (thickness) between substrate channel area 51 and second portion 37 may be set to 20 nanometers and the second spacing distance (thickness) between substrate channel area 52 and first portion 41 may be set to 40 nanometers. Without limiting this feature of the invention to any particular theoretical explanation or model, it is believed that the enhancement in hot-electron tunneling occurs from the following effects. First, it is believed that the smaller thickness between channel area 51 and first portion 37 of layer 34 enhances the n-type conductivity (i.e., inversion layer) of area 51 with respect to that of channel area 52 such that less potential voltage is "dropped" across area 51 and more is "dropped" across area 52 (i.e., area 51 has higher conductance than area 52). This allows more of the potential applied between regions 20 and 22 to be "dropped" across the pinch-off region, which enhances the generation and energy level of hot-electrons when the pinch-off region is located in area 52. Second, it is believed that the smaller thickness tends to confine the pinch-off region more to channel area 52 and to boundary 54 rather than channel area 51. Third, it is believed that the smaller thickness enhances any electric field directed from second portion 37 of floating-gate layer 34 to area 51 which aids the tunneling of electrons into layer 34. (This electric field is believed to be substantially perpendicular to substrate surface 13.) In may be appreciated that this feature may be combined with the above-described embodiment where additionally positive potential is coupled to the layer 34 via substrate region 22, to further enhance the direction of hot-electrons onto floating gate 34.

Specific examples of applying voltages to memory cell 15 during a programming operation are discussed in greater detail below, after discussing the approximate equivalent electrical circuit for memory cell 15. Having generally described the mechanisms for introducing (programming) electrons onto floating gate layer 34, the preferred mechanism for removing (erasing) electrons is now described.

In the preferred embodiments of the present invention, electrons are removed from floating gate layer 34 to second layer 40 by the Fowler-Nordheim tunneling mechanism. In this mechanism, the tunnel-current density is proportional to the square of the electric field between layers 34 and 40 times an exponential function of the electric field, as indicated below:

$$J = C_1 E^2 \exp(-E_0/E) \qquad (4)$$

where E is the electric field between layers 34 and 40 at the point of electron emission, and $C_1$ and $E_0$ are constants and are functions of the electron's effective mass and the effective barrier height between conductor 34 and the dielectric material between layers 34 and 40. From a practical point of view, a threshold amount of electric field $E_{TUN}$ must be reached before a significant amount of current can be tunneled. In a preferred embodiment of the present invention, an exemplary significant amount of current is on the order of approximately $1 \times 10^{-5}$ amperes per square centimeter (A/cm$^2$). Given the structural features and dimensions of layers 34, 40 and the dielectric therebetween, the threshold electric field $E_{TUN}$ corresponds to a tunneling threshold voltage $V_{TUN}$, which typically ranges between 11 V–15 V for enhanced-emission tunneling structures using a SiO$_2$ dielectric (50 nm–70 nm thick), as discussed in more detail below.

During erasure operations according to the present invention, the voltage of second layer 40 is raised to a point where a 11 V–15 V potential difference between layers 40 and 34 is developed. Due to the small capacitive coupling between layers 34 and 40, the voltage of layer 34 rises somewhat as the voltage of second layer 40 rises. However, the capacitive coupling between floating-gate layer 34 and substrate 12 and substrate region 22 reduces the amount the voltage of floating-gate layer 34 rises in response to the voltage on second layer 40. When the voltage difference between layers 40 and 34 reaches the threshold voltage $V_{TUN}$, electrons begin tunneling from floating-gate layer 34 to second layer 40 and the voltage of the floating-gate layer 34 begins to rise with the voltage on second layer 40. Depending upon how fast the voltage on layer 40 is raised and upon the rate at which electrons can be tunneled from layer 34, the voltage difference between layers 40 and 34 may substantially exceed the threshold tunneling voltage $V_{TUN}$. At some point, the voltage on second layer 40 ends its rise and settles at a constant value. The tunneling of electrons from layer 34 continues until either (1) the voltage difference between layers 40 and 34 settles back down to slightly less than $V_{TUN}$, or (2) the voltage of layer 40 is ramped down to a lower potential. During erasure operations according to the present invention, substrate regions 20 and 22 are preferably grounded to substantially zero volts and second layer 40 is raised up to a voltage of 20 V or more.

One advantage of providing erasure of electrons to the second layer 40 rather than to a substrate region, as is done in the flash-EPROM device art, is that the junction isolation constraints for the substrate regions (such as regions 20 and 22) may be relaxed. Consequently, the substrate regions may be spaced closer together to provide a more compact memory cell. The explanation for this is as follows. When erasure is done to a substrate region, as with many flash-EPROM devices, a large voltage of approximately 15–20 V is applied to the substrate region with respect to the substrate and to other un-biased substrate regions. This voltage causes electrons to tunnel from the floating gate to the biased substrate region. The high voltage applied to the substrate region causes the p-n junction formed between the substrate region and the substrate to become reverse biased and the depletion width of the p-n junction to extent outward. To prevent the junction from breaking down or from punching through to another substrate region, and hence shorting out the applied voltage needed for erasure, the substrate region must be formed with sufficient junction depths with junction radii and must be placed a sufficient distance away from an adjacent substrate region in these flash-EPROM devices. As well known to the semiconductor fabrication art, the magnitudes of the junction depths, junction radii, and spacings between adjacent substrate regions increase with the applied voltage. Thus, by providing erasure to second layer 40 rather than to a substrate region, the above junction depths, radii, and spacings used in the present invention may be much smaller than those used in currently available flash EPROM memory devices since such high voltages are not used. This further contributes to the ability to provide a more compact memory cell according to the present invention. On the other hand, other types of flash EPROM memory devices use small junction depths, radii and spacings but perform the erasure operation on a block of memory cells, or even over the entire memory array. The blocks are typically arranged along columns of the memory array and special grounding techniques are used for the block erasure which prevent large breakdown currents from occurring. This approach, however, is not compatible with full-featured capabilities of the EEPROM art, as a block of memory cells must be erased in order to erase a single memory cell or a row of memory cells.

From an inspection of equation 4, the tunneling current during the erasure operation can be enhanced significantly by increasing the electric field during erasure. This may be done in the following ways, which are discussed with reference to three further embodiments of memory cell according to the present invention shown at 15a in FIG. 4A, 15b in FIG. 4B, and 15c in FIG. 4C, respectively. The first way, of course, is by increasing the potential applied to second layer 40. This is particularly useful when the top surface of floating gate layer 34 is flat and smooth, such as shown by memory cell 15a shown in FIG. 4A. The reference numerals in FIG. 4A are the same as those shown in FIG. 1 with the exception of the addition of the notation "a". The square corner edges are shown at reference numeral 39a. In this embodiment, the threshold tunneling voltage $V_{TUN}$ is a function of the thickness of the dielectric between layers 34 and 40, the material properties of the layers 34 and 40, the material properties of the dielectric 50 between layers, and of the curvature of the corners of floating-gate layer 34.

A second way of enhancing the tunneling current is by introducing one or more enhanced-emission structures on the top surface of floating gate layer 34 which is directed towards second layer 40. Each such enhanced-emission structure comprises a rounded emitting surface having a radius of curvature which enables an enhancement of the local electric field near the rounded surface, the enhancement of the electric field being in the range of approximately 2–10 times the electric field occurring over a flat, planar surface. Such an enhanced emission structure concentrates the electric field lines at its rounded emitting surface. Hence, the electric field at the points of electron emission can be greatly increased while maintaining or lowering the potential difference between layers 34 and 40. Such an enhanced emitting surface may comprise a radius of curvature which is small (i.e., less than) in relation to the spacing distance, or "dielectric thickness", between layers 34 and 40. The spacing distance and "dielectric thickness" are explained as follows. As indicated above, second portion 43 of second layer 40 overlies floating gate layer 34 and is electrically insulated therefrom. Preferably, second portion 43 is spaced from floating gate layer 34 by a selected distance to provide the electrical insulation, which is preferably provided by a dielectric material of a selected thickness. Therefore, the preselected distance is intended to mean the largest perpendicular distance between portion 43 and floating gate layer 34. Thus, with regard to the enhanced emitting surface, the value of the radius of curvature of the enhanced emission structure is preferably less than this selected distance between said first layer (34) and said second layer (40).

In the embodiment of the present invention shown in FIG. 1, exemplary enhanced emission structures are shown at reference numerals 39. Each of these structures is disposed as a corner edge of floating gate layer 34 on the top surface of floating gate layer 34 next to a side face 36 of floating gate layer 34. The top surface of layer 34 is disposed away from substrate surface 13 and each side face 36 disposed perpendicular to substrate surface 13. Corner edge 39 is disposed between the top surface and side face 36 of layer 34, and facing second layer 40. Preferably, corner edge 39 forms an acute angle between the top surface and side face 36. Corner edge 39 preferably comprises a substantially rounded emitting surface at which the electric field is greatly enhanced over the electric field present at, for example, the planar region at the middle of floating gate layer 34.

Another example of an enhanced emission structure comprising a corner edge and having a similar function to edge 39 of FIG. 1 is shown by memory cell 15b in FIG. 4B. The reference numerals in FIG. 4B are the same as those shown in FIG. 1 with the exception of the addition of the notation "b". The enhanced emission structures according to this embodiment are shown at 39b.

A third way of enhancing tunneling current is by forming a texturized surface having a plurality of bumps (e.g., surface texture) on the top surface of floating-gate layer 34. The bumps are shown in memory cell 15c of FIG. 4C and are indicated by the serration on the top surface of layer 34. Each bump comprises an enhanced emission structure and may further comprise a small projection from the top surface of layer 34 and a spherically rounded top surface, or tip, having a radius of curvature which enables an enhancement of the local electric field near the rounded surface, the enhancement of the electric field being in the range of approximately 2–10 times the electric field provided over a flat, planar surface. An exemplary size of such an bump is a base width of approximately 140 nanometers and a height of approximately 360 nanometers. As is well known in the silicon processing art, polysilicon is not a single crystalline material but is comprised of an aggregation of numerous small individual crystals, often called grains. When oxidized, it is believed that the grains at the surface of the polysilicon layer give rise to the bumps. Typically, a density of $5 \times 10^9$ bumps may be formed per square centimeter of top surface. Suitable bumps can be generated over a range of processing conditions and a range of sizes, and are not limited to the particular exemplary sizes stated above. Finally, the bumps may also each comprise a radius of curvature which is small (i.e., less than) in relation to the dielectric thickness between layers 34 and 40.

It is believed that the rounded surfaces of the bumps concentrate the electric field lines (and hence strength) by attracting field lines away from the surface valley regions formed between bumps. The threshold tunneling voltage $V_{TUN}$ is thus a function of the number and geometric shape of the enhanced emission structures and of the material properties of the layers 34,40 and of the dielectric. In general, the threshold tunneling voltage $V_{TUN}$ for such enhanced emission structures is substantially less than with embodiments having smooth conductor surfaces with comparable dielectric thicknesses.

As a further feature of the present invention, such above-described enhanced emission structures are included so as to reduce the threshold tunneling voltage and to thereby reduce the required voltage on second layer 40 during erasure. This allows the isolation requirements for an embodiment of the present invention using this feature to be relaxed and the cell size thereby reduced. Additionally, it may be appreciated that the above described enhanced emission structures may be combined with one another to further enhance the tunneling of electrons from floating gate 34 to second layer 40. For example, a further embodiment of the present invention may comprise both a texturized surface (bumps) and well as enhanced emission corners 39.

In each of these further embodiments employing enhanced emission structures, the flat bottom surface of second layer 40 which faces the top surface of layer 34 is relatively smooth in comparison to the enhanced emission structures shown in memory cells 15 (FIG. 1), 15b (FIG. 4B), and 15c (FIG. 4C). As such, the flat bottom surface of layer 40 which faces the top surface of layer 34 does not locally concentrate the electric field in the same above-described manner that the enhanced emission structures on the top surface of layer 34 locally concentrate the electric field near their emitting surfaces. Additionally, the rounded bottom surface shape of these portions of layer 40 located opposite a corresponding edge 39 tend to lower the value of the local electric field entering such rounded surface portions relative to the local electric field entering flat bottom surface of layer 40. These differences with respect to the enhanced emission structures in cell 15, 15b, and 15c make it harder to tunnel electrons from layer 40 to layer 34 than it is to tunnel electrons from layer 34 to layer 40. That is, these differences in structure lead to a substantial difference in "forward" and "reverse" tunneling current characteristics.

More specifically, in the "forward" mode, a positive tunneling voltage is applied between layers 34 and 40 (with layer 40 being more positive) and electrons are tunneled from layer 34 to layer 40 with the aid of the enhanced emission structures present on the top surface of layer 34. In the "reverse" mode, a much larger negative tunneling voltage would need to be applied (layer 40 being more negative) to tunnel electrons from layer 40 to layer 34, since the above described enhanced emission structures would have much more limited effect, in contrast to the forward mode. For a comparable magnitude of current, exemplary values of applied forward and reverse voltages are a forward tunneling voltage of $V_{TUN}$ in the range of approximately +11 to +15 V and a reverse tunneling voltage of $V_{TUN}$ of approximately −25 V to −35 V. In the preferred embodiments of the present invention, the "reverse" mode is undesirable as it competes with the programming operations by removing electrons from floating gate 34. Thus, by increasing the negative voltage required for tunneling in the "reverse" mode, the effects of this competing erasure process can be significantly reduced.

Thus, this difference between forward and reverse tunneling voltages lead to the characterization of the tunneling region between layers 34 and 40 as being uni-directional. In those embodiments of the present invention comprising one or more enhanced emission structures, the uni-directional nature of such structures helps to ensure that electrons will not be inadvertently introduced onto floating gate layer 34 from layer 40. This aids in ensuring the integrity of a compact memory cell according to the present invention using this further feature.

ELECTRICAL CIRCUIT MODEL

Having generally described the structure of memory cell 15 and the mechanisms for introducing (programming) electrons onto floating gate layer 34 and for removing (erasing) electrons from floating gate layer 34, an approximate equivalent circuit model for the memory cell according to the present invention is now described. Shown at 80 in FIG. 3 is an approximate equivalent electrical circuit of the non-volatile memory cell illustrated in FIGS. 1 and 2 during read, programming, and erasure operations of the memory cell. Circuit 80 comprises a first transistor 81 for modeling the modulating (gating) action of portion 41 of layer 40 over predetermined channel area 52, a second transistor 82 for modeling the gating action of portion 37 of floating gate 34 over predetermined channel area 51, a coupling capacitor 84 for representing the capacitive coupling between layer portion 35 and substrate region 22, and a tunneling capacitor 86 for modeling the Fowler-Nordheim tunneling current occurring during erasure operations. The above-described capacitances $C_1$, $C_2$, and $C_3$ are also noted in FIG. 3, where capacitance $C_1$ is associated with tunneling capacitor 86, capacitance $C_2$ is associated with the gate-to-channel capacitance of transistor 82, and capacitance $C_3$ is associated with capacitor 84. To most easily correspond circuit 80 to memory device 15 shown in FIG. 1, appropriate reference numbers from FIG. 1 have been duplicated in FIG. 3 at the appropriate terminals of circuit components 81, 82, 84, and 86. Each of these components is now discussed.

Transistor 81 comprises a first conduction terminal (drain) formed by boundary 54, a second conduction terminal (source) formed by substrate region 20, and a modulation terminal (gate) formed by first portion 41 of second layer 40. Transistor 82 comprises a first conduction (drain) formed by substrate region 22, a second conduction terminal (source) formed by boundary 54 and coupled to the first conduction terminal (drain) of transistor 81, and a modulation terminal (gate) formed by second portion 37 of floating gate layer 34. The voltages applied to the bit lines comprising substrate regions 20 and 22, respectively, are indicated by the notation $V_{B0}$ and $V_{B1}$, respectively, as is done in FIG. 1. The coupling of the conduction terminals of transistors 81 and 82 in the above-described manner forms a channel conduction path between $V_{B1}$ and $V_{B0}$ that has a conductance, as measured in mhos, which is modulated by the potentials on the gates of transistor 81 and 82. The potential on the gate of transistor 82 is a function of the net charge on floating-gate layer 34 and, as described above, represents the state of information being stored in memory cell 15 (circuit 80). Thus, the conductivity of the channel path between $V_{B1}$ and $V_{B0}$ is a function of the information being stored by memory cell 15. The potential on the gate of transistor 81 is coupled to the memory array control circuitry and is used to select the memory cell for reading of information and for programming. In a preferred embodiment of the present invention, the gate of transistor 81 is coupled to a word line of a memory array, such as array 10 of FIG. 1. The voltage applied to the gate of transistor 81 (second layer 40) is indicated by the notation symbol $V_{W1}$, as done in FIG. 1. Thus, to cause the channel path between $V_{B1}$ and $V_{B0}$ to become conductive, the gates of both transistors 81 and 82 must be activated with sufficient voltage.

Coupling capacitor 84 ($C_3$) comprises a first terminal formed by substrate region 22 and a second terminal formed by the first portion 35 of floating gate layer 34. As such, the second terminal of coupling capacitor 84 ($C_3$) is coupled to the gate terminal of transistor 82 and provides means for selectively coupling voltage to the gate terminal of transistor 82 (floating gate) during programming, erasure, and reading operations. Tunneling capacitor 86 ($C_1$) comprises a first terminal formed by floating gate layer 34 and coupled to the gate terminal of transistor 82, and a second terminal formed by second layer 40 and coupled to word line $V_{W1}$. The arrow symbol of tunneling capacitor 86 represents the preferred tunneling direction of electrons, the direction from floating gate layer 34 to second layer 40. The voltage on floating gate 34 is represented in FIG. 3 by the symbol notation $V_{FG}$.

Circuit 80 is of particular use in understanding the application of voltages $V_{B0}$, $V_{B1}$, $V_{W1}$, to memory cell 15 during reading, programming, and erasure operations. Circuit 80 is also of further use in understanding the operation of memory cell 15 within an array of such memory cells. In the preferred memory array embodiments of the present invention discussed below, a plurality of memory cells are organized into a matrix having m rows and n columns. (In describing the memory-array embodiments of the present invention, the index i is used to denote a particular row of the rows 1-m and the index j is used to denote a particular column of the columns 1-n.) Preferably, the cells of each row i have their respective gates coupled together and are selected as a group by the application of an appropriate voltage on the $i^{th}$ row (or word line). For the first word line, this is denoted as $V_{W1}$, which has been shown in FIGS. 1–3. Further, the corresponding substrate regions 20 of the cells in the same column are coupled together and the corresponding substrate regions 22 of the cells in the same column are coupled together. In the preferred embodiments, a particular memory cell may be activated for reading and for programming by activating its corresponding row via voltage $V_{W1}$ (its second layer 40) and by activating its corresponding column via a potential difference between its corresponding substrate regions 20 and 22 ($V_{B0}$, $V_{B1}$).

Above, it was stated that circuit 80 is an approximate equivalent electrical circuit of memory cell 15. The approximate nature of circuit 80 is due to the fact that circuit 80 implies that the first conduction terminal (drain) of transistor 81 is coupled to the second conduction terminal (source) of transistor 82 at a regular, ohmic-semiconductor junction (54). However, as can be seen in FIG. 1, and in the preferred embodiments of the present invention, these conduction terminals of transistor 81 and 82 are coupled together at a virtual, non-ohmic-semiconductor junction. As known in the semiconductor device-physics art, any hot electrons in a semiconductor channel region are "cooled" once they enter an ohmic semiconductor junction area, such as for example substrate regions 20 and 22. Such "cooling" is implied by the coupling of transistors 81 and 82 at boundary 54 in FIG. 3, but in fact no such "cooling" occurs since there is no ohmic semiconductor junction area at boundary 54 in FIG. 1. In the preferred embodiments of the present invention, there are electrons being "heated" at boundary 54 and there may be, depending upon bias conditions, hot-electrons passing through boundary 54. Circuit 80, therefore, is approximate in this one respect but nonetheless is useful given the above qualification of boundary 54 being a non-ohmic junction. This qualified understanding of circuit 80 is important for programming operations, but much less important for reading and erasure operations. Finally, it may be appreciated that the present invention and features thereof may still be practiced, although perhaps not as optimally from the point of view of compact size, by making boundary 54 ohmic, as by forming an n-type doped region at boundary 54.

DETAILED DISCUSSION OF CELL OPERATION

Having generally described the structure of memory cell 15, the mechanisms for introducing (programming) electrons onto floating gate layer 34 and for removing (erasing) electrons from floating gate layer 34, and an approximate equivalent circuit model 80, the details of reading, programming, and erasing information from memory cell 15 are now described. In the preferred embodiment of the present invention, memory cell 15 is first erased before programming operations if memory cell 15 is not already in an erased state (second binary data state described below). In a further preferred embodiment discussed below in greater detail, memory cell 15 is erased regardless of the memory state of cell 15. Then, during programming operations, electrons are introduced onto floating gate layer 34 if a first binary data state is to be stored in memory cell 15. If the second binary data state is to be stored, no electrons are introduced. In the preferred embodiment, a voltage is applied to substrate region 22 with respect to substrate region 20 to introduce electrons onto floating-gate layer 34 to "write" the first binary state and substantially no voltage is applied to substrate region 22 with respect to substrate region 20 to "write" the second binary state. In the preferred embodiment, the "writing" of the second binary state substantially maintains the erased state of the floating gate. However, as mentioned above, it may be appreciated that the writing of the second state may comprise the introduction of a small amount of electrons onto the floating gate ("programming") which provides a distinguishable charge level from that of the first binary state. Thus, it may be appreciated that it is not essential for the writing of the second binary state to substantially maintain the erased state.

Also during writing of the first and second binary states, the word line voltage $V_{W1}$ on second layer 40 is activated to select memory cell 15. The information may then be read, as required by the user of the memory array, by selecting memory cell 15 and by applying a sense voltage between regions 20 and 22, where the sense voltage is less than the potential used for programming to prevent inadvertent programming of the device.

This generally describes the erasure, programming, and reading operations and the relationships therebetween. Each of these operations is discussed below in greater detail with reference to preferred embodiments of the present invention and with reference to an operational voltages table, TABLE I.

TABLE I shows the preferred voltages on substrate regions 20, 22, 24, and on layer 40 during the following operations: erasing memory cell 15, writing the first binary state, writing the second binary state (maintaining the erased state), reading memory cell 15 in a first manner, and reading memory cell 15 in a second manner. TABLE I also shows the voltages to be applied to other word lines, such as word line 45 shown in FIG. 2, during these operations to

TABLE 1

|  | Erase all Memory Cells on a Word Line | Write First State (Program Cell) | Write Second State (Maintain erase state) | First Read Memory Cell | Second Read Memory Cell |
| --- | --- | --- | --- | --- | --- |
| Substrate Region 20. (Bit Line $V_{B0}$) | 0 V | 0 V | 0 V | 0 V | 2 V |
| Substrate | 0 V | 7 V–10 V | 0 V | 2 V | 0 V |

TABLE 1-continued

| | Erase all Memory Cells on a Word Line | Write First State (Program Cell) | Write Second State (Maintain erase state) | First Read Memory Cell | Second Read Memory Cell |
|---|---|---|---|---|---|
| Region 22. (Bit Line $V_{B1}$) Substrate Region 24. (Bit Line $V_{B2}$) | 0 V | 0 V | 0 V | 2 V | 0 V |
| Second Layer 40. (Word Line Voltage $V_{W1}$) | −20 V or higher | 1 V–2 V | 1 V–2 V | 3 V– 5 V | 3 V– 5 V |
| Second Layer 45. (All other Word Lines) | 0 V | 0 V | 0 V | 0 V | 0 V | prevent inadvertent reading, erasing, and programming of unselected memory cells. Each of the operations are provided in a respective column of TABLE I and each of the regions and layers is indicated in a respective row of TABLE I.

In the preferred embodiment of the present invention, and for the purposes of simplifying the discussion, the voltage of substrate 12 is maintained at zero volts during the operation of the memory cell. However, it may be appreciated that the present invention is not limited to this substrate bias voltage and that other bias voltages may be used during program, erase, and reading operations, as may be taught by the semiconductor memory device art.

For erasing memory cell data information, the present invention comprises erasure means for removing electrons from floating gate layer 34 to second layer 40, the erasure means comprising means for applying an erase voltage to second layer 40 having a value of approximately 20 V or higher and for applying a grounding bias voltages (~0 V) to both of substrate regions 20 and 22. Upon application of these voltages, as described previously, substrate region 22 steers floating gate 34 towards ground, a tunneling voltage $V_{TUN}$ is developed between second layer 40 and floating gate 34, and electrons are removed from floating gate 34 to second layer 40. The process of applying voltages to substrate regions 20 and 22 and to second layer 40 by the erasure means may be formally described as follows, where a separate application means is used for applying voltages to each of these elements:

(1) a first application means for selectively applying a first grounding bias potential to first substrate region 20 (row 1, column 1 of TABLE I);

(2) a second application means for selectively applying a second grounding bias potential to second substrate region 22, the first and second grounding bias potentials being substantially the same (rows 1 and 2, first column of TABLE I); and (3) a third application means for selectively applying an erase control potential to second layer 40 (row 4, column 1 or TABLE I).

With reference to circuit model 80 in FIG. 3 and memory device 15 in FIG. 1, the above applied grounding bias potential on substrate region 22 is substantially coupled to floating-gate layer 34 via coupling capacitor 84 ($C_3$) and the gate capacitance of transistor 82 ($C_2$). In the preferred embodiment of the present invention, the combined capacitance of coupling capacitance 84 ($C_3$) and of the gate of transistor 82 ($C_2$) is larger than the capacitance of tunneling capacitor 86 ($C_1$). The preferred embodiment of the present invention, the combined capacitance of coupling capacitance 84 ($C_3$) and of the gate of transistor 82 ($C_2$) is larger than the capacitance of tunneling capacitor 86 ($C_1$). Thus, the potential of floating-gate layer 34 is steered towards the grounding bias potential (e.g., ~0 V) by means of the sum of capacitance 84 ($C_3$) and the gate capacitance of transistor 82 ($C_2$). The erase control potential (e.g., >~20 V), as coupled by tunneling capacitor 86, has a weak effect. With reference to the above discussion on the erasure mechanism, the erase control potential and the grounding bias potentials are selected such that electrons are removed from floating gate layer 34 to second layer 40 upon application of the grounding bias potential to substrate regions 20 and 22, and the erase control potential to second layer 40. It may be appreciated that the above discussion of erasure in memory cell 15 is applicable to memory cells 15a, 15b, and 15c shown in FIG. 4.

For writing data information onto floating gate layer 34, preferably after the floating gate has been erased by the above erasure means, the present invention comprises programming means for selectively applying a first data potential difference across substrate regions 20 and 22 when the first binary state is to be written and a second data potential difference across substrate regions 20 and 22 when the second binary state is to be written. The programming means further comprise means for applying a programming control potential of ~1 V to ~2 V to second layer 40 so as to create a conducting channel in channel area 52. Preferably, the first data potential difference is in the range of approximately 7–10 volts, with region 22 being more positive than region 20, and is sufficient to generate hot-electrons in one or both of channel areas 51 and 52. Additionally, the second data potential difference is near zero voltage so as to maintain the erased state of floating gate 34. The process of applying voltages to substrate regions 20 and 22 and to second layer 40 by the storing means may be formally described as follows:

(1) means for applying one of a first data potential difference and a second data potential difference between first substrate region 20 and second substrate region 22, the first data potential difference being applied when data to be stored in memory cell 15 has one binary state and the second data potential difference being applied when data to be stored has the other binary state (columns 2 and 3 of rows 1 and 2 of TABLE I); The potential difference is applied by a first application means for applying a first potential to substrate region 20 and a second application means for applying a second potential to substrate region 22;

(2) a third application means for selectively applying a program control potential to second layer 40, the program control potential being selected to invert the conductivity type of the second predetermined channel area 52 to provide a conduction path between first substrate region 20 and first predetermined channel area 51.

The first, second, and third application means may each comprise standard read/write circuitry known to the semiconductor memory art. With reference to the above discussion on the hot-electron generation mechanisms, it may be appreciated that the first data potential difference is selected such that electrons are introduced onto floating gate layer 34 from substrate 12 upon application of the first data potential difference and the program control potential as described above. Additionally, and as an additional feature of the present invention, the second data potential difference is selected such that electrons are prevented from being introduced onto floating gate layer 34 from substrate 12 upon application of the second data potential difference and the program control potential as described above.

During the write operation in the preferred embodiment of the present invention, substrate region 20 is biased with a ground potential and a potential representing the desired binary state is applied to substrate region 22 to provide the first and second data potential differences. However, it may be appreciated that the opposite case may be practiced where a bias potential of approximately 7 to 10 volts is applied to substrate region 22 and a potential representing the desired binary state is applied to substrate region 20 to provide the above-described first and second data potential differences. Thus, there are two way in which the first and second data potential differences may be applied.

In the first way:
(1) the first application means further for applying a program bias potential to first substrate region 20 of preferably zero volts; and
(2) the second application means further for selectively applying one of a first data potential. (~7 V–10 V) and a second data potential(~0 V) to second substrate region 22, the first data potential being applied when the data to be stored in memory cell 15 is the first binary state and the second data potential being applied when the data to be stored is the second state.

In the second way:
(1) the first application means further for selectively applying one of a first data potential (~0 V) and a second data potential (~7 V–10 V) to first substrate region 20, the first data potential being applied when the data to be stored in memory cell 15 is the first binary state and the second data potential being applied when the data to be stored is the second state; and
(2) the second application means further for applying a program bias potential of preferably ~7 V–10 V to second substrate region 22.

For reading of data information from memory cell 15 (i.e., sensing), the present invention encompasses at least two alternate reading means, or reading mode operations, each of which is discussed below. Each of the reading mode operations comprises a read reference potential of ~0 V being applied to one of substrate regions 20 and 22 and a sense potential of ~2 V being applied to the other of the substrate regions 20 and 22. The two reading mode operations differ in the direction of the sense current between regions 20 and 22. Each of the first and second reading means comprises the following application means:

(1) the above-described first application means further for selectively applying one of the reference and sense potentials to first substrate region 20 (row 1, columns 4 and 5 of TABLE I);
(2) the above-described second application means further for selectively applying the other of the reference and sense potentials to second substrate region 22 (row 2, columns 4 and 5 of TABLE I);
(3) the above-described third application means further for selectively applying a read control potential to second layer 40.

In the above-mentioned preferred embodiment of the present invention, the read control potential ranges between approximately 3 V and approximately 5 V for both first and second reading means, as indicated in the fourth row, fourth and fifth columns of TABLE I. The read control potential is also referred to as the sense control potential.

With reference to circuit model 80 in FIG. 3 and memory device 15 in FIG. 1, the above reference and sense potentials on substrate regions 20 and 22 set up a potential difference between regions 20 and 22 for sensing the state of floating gate layer 34 and the above applied read control potential second layer 40 inverts the conductivity type of channel area 52 so that the potential difference between regions 20 and 22 may be applied across channel area 51, thereby sensing the state of floating gate 34. One difference between the first and second reading means is that the polarity of the sensing voltage, and subsequent sensing current, are opposite (i.e., reversed from one another). Another difference, as discussed below in greater detail, is that less voltage is coupled to floating gate 34 by the second reading means (second reading mode) than by the first reading means (first reading mode).

Having thus described preferred programming, erasure, and sensing (reading) operations according to the present invention, it may be appreciated that second layer 40 provides means for enabling the selection of the programming means, erasure means, and sensing (reading) means for memory cell 15, particularly when memory cell 15 is formed as part of a memory array of such cells.

Having described the preferred programming and erasure means of the present invention, it may be appreciated that the memory cell of the present invention may be utilized in the following ways. First, it may be appreciated that a memory cell according to the present invention may be used in a "write-one-time" manner where the memory device is manufactured in an erase condition. The user would write data to the device once and would not utilize the above described erasure means. (The user, however, would be utilizing other features of present invention which provide for a compact memory cell.) Second, it may be appreciated that the above-described erasure means may be used conditionally to erase the memory cell only when its state is being changed from a programmed state (first binary state) to an erased state. In this case, electrons are removed from floating gate layer 34 by the erasure means before the second data potential difference is applied between substrate regions 20 and 22 by the programming means. The conditional erasure has the benefit of increasing the endurance of the memory cell as it avoids a cycle of erasure followed by programming when the first binary state is to be written to a memory cell already in the first binary state. However, it has a disadvantage of complicating the operation of the memory cell. Finally, it may be appreciated that the erasure operation may occur unconditionally before each programming operation for a more simple operation of the memory device. In this case, electrons are removed from floating gate layer 34 by the erasure means before either the first or second data potential differences are applied between substrate regions 20 and 22 by the programming means.

Having described the means for programming, erasing, and reading from memory cell 15 at a level needed for practicing the preferred embodiments of the present invention, a more detailed analysis is given for these operations for a preferred embodiment comprising the above detailed structural parameters and the above operational voltages detailed in TABLE I. In this analysis, specific values of floating gate voltages during the operations are given. In the above detailed structural parameters, the following capacitive coupling coefficients were presented: the capacitive coupling ratio between floating gate layer 34 and second layer 40 was given as $R_1 \approx 0.2$, the capacitive coupling ratio between layer 34 and substrate channel area 51 was given as $R_2 \approx 0.2$, and the capacitive coupling ratio between layer 34 and substrate region 22 was given as $R_3 \approx 0.6$. (As mentioned above, ratio $R_1$ is associated with capacitance $C_1$, ratio $R_2$ is associated with capacitance $C_2$, and ratio $R_3$ is associated with capacitance $C_3$.) Additionally, the threshold voltage for area 51 (transistor 82) was given as ~3 V and the threshold voltage for channel area 52 (transistor 81) was given as ~1 V.

In this preferred embodiment, information is stored in digital form having two digital states wherein the first digital state is represented by a floating gate voltage which is substantially a first predetermined margin voltage $\Delta V_{MAR1}$ below the threshold voltage for channel area 51 during the read operation, and wherein the second digital state is represented by a floating gate voltage which is substantially a second predetermined margin voltage $\Delta V_{MAR2}$ above the threshold voltage for area 51 during the read operation. For the purposes of discussion, the voltage on floating gate layer 34 is represented by $V_{FG}$ and the threshold voltage for channel area 51 is represented as $V_{T,FG}$ (the subscript notation "FG" representing portion 37 of floating gate layer 34 which is disposed over area 51). In this preferred embodiment, the threshold voltage $V_{T,FG}$ is approximately 3 volts and the first and second margin voltages are equal in magnitude to approximately $V_{MAR} \approx 1$ volt. The voltages present on the floating gate for each of the binary states during a read operation are as follows:

$$V_{FG,R}^0 = V_{T,FG} - V_{MAR} \text{ (first binary state)} \quad (5)$$

$$V_{FG,R}^1 = V_{T,FG} + V_{MAR} \text{ (second binary state)} \quad (6)$$

where the superscripts "0" and "1" to the floating gate voltage "$V_{FG}$" represent the first and second binary states, respectively, and the subscript "R" indicates that these floating-gate voltages are taken during the read operation. As discussed below, the floating gate charge on layer 34 corresponding to the voltage $V^0_{FG,R}$ is set during the program operation and the floating gate charge on layer 34 corresponding to the voltage $V^1_{FG,R}$ is set during the erasure operation. With a $V_{MAR}$ of 1 V, there is approximately a 2 V difference in the floating gate voltages for programmed and erased states. Using the relationship Q=CV and the exemplary total capacitance $C_T$ of 5 fF, the charge difference between programmed and erase states on floating gate layer 34 is approximately 10 femto ($1 \times 10^{-14}$) Coulombs.

During each of the program, erase, and read operations, the voltage on the floating gate is altered from its quiescent ground-state value by the capacitive coupling from surrounding electrodes, as well as by the introduction and removal of electrons. The quiescent ground state is defined herein as the condition where the voltages of the surrounding electrodes are in their normal "resting" state, which is approximately zero volts for the surrounding electrodes in this preferred embodiment. During the read operation, where preferably no electrons are added or removed from floating-gate layer 34, the potential of floating-gate layer 34 is raised an amount $\Delta V_R$ upon application of the read potentials to second layer 40 and substrate regions 20 and 22, and subsequently lowered by $\Delta V_R$ when the reading potentials are removed after completion of the read operation. With reference to equations 1-3 above, $\Delta V_R$ is a function of the capacitive coupling the floating gate has to each of the surrounding electrodes and of the voltages of the surrounding electrodes during read operations. Exemplary values of $\Delta V_R$ range between ~1.0 V to ~3.0 V, as discussed below.

Likewise, during the erase operation, the potential of floating gate layer 34 is raised by an amount $\Delta V_E$ upon application of the erase potentials to second layer 40 and substrate regions 20 and 22 (in the absence of electron tunneling) and subsequently lowered by $\Delta V_E$ when the erase potentials are removed after completion of the erase operation. Exemplary values of $\Delta V_E$ range between ~3.0 V to ~5.0 V, as discussed below. Likewise, during the programming operation, the potential of floating gate layer 34 is raised by an amount $\Delta V_P$ upon application of the programming potentials to second layer 40 and substrate regions 20 and 22 (in the absence of electron tunneling) and subsequently lowered by approximately $\Delta V_P$ when the erase potentials are removed after completion of the programming operation. Exemplary values of $\Delta V_P$ range between ~5.0 V to ~7.0 V, as discussed below.

As indicated above, the application of the read voltage increases the potential of the floating gate by a predetermined amount $\Delta V_R$ due to the capacitive coupling of voltages from second layer 40 and substrate region 22, as discussed above. Thus, when the read operation is completed, the voltage on the floating gate is reduced by $\Delta V_R$ when the memory cell is returned to its quiescent ground state. The floating gate voltage for each of the binary states during the quiescent ground state is $\Delta V_R$ less than its corresponding value give by equations 5 and 6, and is given below as:

$$V_{FG,G}^0 = V_{T,FG} - V_{MAR} - \Delta V_R \text{ (first binary state)} \quad (7)$$

$$V_{FG,G}^1 = V_{T,FG} + V_{MAR} - \Delta V_R \text{ (second binary state)} \quad (8)$$

where the subscript "G" to the floating gate voltage $V_{FG}$ represents the ground quiescent state where each of substrate regions 20 and 22 and second layer 40 are at zero volts. From the above coupling coefficients and from the voltages given in TABLE I, the voltage change $\Delta V_R$ may be calculated according to equation 3 for each of the read operations. For the first read operation, a $\Delta V_R$ of approximately 2.6 volts is obtained by multiplying the voltage of layer 40 by the coefficient $R_1$ (to obtain ~1 V) and by adding it to the product of the voltage of substrate region 22 and coefficient $R_3$ (to obtain ~1.6 V, for a total of ~2.6 V). For the second read operation, a $\Delta V_R$ of approximately 1.0 volts is obtained by multiplying the voltage of layer 40 by the coefficient $R_1$ (~1 V) and neglecting the effect of substrate region 22 as its voltage is substantially zero.

From the above ground-state floating gate voltages for the binary states given by equations 7 and 8, the requirements of the program and erasure operations may be readily determined for this further embodiment of the present invention. As mentioned above, the floating gate voltage for the first state $V^0_{FG}$ is set during the program operation. This means that at the end of the programming operation, while the programming voltages are still applied to couple $\Delta V_P$ to the floating gate, the voltage of the floating gate is at:

$$V_{FG,P}^0 = V_{T,FG} - V_{MAR} - \Delta V_R + \Delta V_P \quad (9)$$

where the subscript "P" on the floating gate voltage $V_{FG}$ represents the end of the programming state. From the above coupling coefficients and from the voltages given in TABLE I for the "Write First State" column, the voltage change $\Delta V_P$ may be calculated according to equation 3. For this calculation, the voltage on second layer 40 is taken as ~1.2 V, the voltage on substrate 22 is taken as ~8 V and the voltage of substrate channel area 51 is taken effectively as 4 V to yield a $\Delta V_P$ of:

$$\Delta V_P \approx R_1(1.2 \text{ V}) + R_2(4 \text{ V}) + R_3(8 \text{ V}) \approx 0.24 + 0.8 + 4.8 \approx 5.84 \text{ V} \quad (10)$$

Substituting this value of $\Delta V_P$ into equation 9 yields a value for $V^0_{FG,P} \approx 7.84$ V$-\Delta V_R$, or a value of ~5.24 V when practicing the first reading-mode operation ($\Delta V_R$=2.6 V) and ~6.84 V when practicing the second reading-mode operation ($\Delta V_R$=1.0 V).

For substrate channel area 51 to be conductive, the "virtual" source terminal of channel area 51, which is near boundary 54, must be at least one threshold voltage (~3 V) below the floating gate potential. Thus, at the end of programming, boundary 54 is approximately at 2.24 V when the first reading-mode operation is used in practicing this preferred embodiment or approximately 3.84 V when the second reading-mode operation is used. In both of these cases, the voltage difference across channel area 52 is sufficient to generate and inject hot electrons into floating gate layer 34, given the voltage on second layer 40. This may be readily seen by examining the operating condition of transistor 81, which corresponds to channel area 52. Under the above bias conditions, the gate-to-source voltage $V_{GS}$ of transistor 81 is 1.2 V and the drain-to-source voltage $V_{DS}$ is 2.24 V and 3.84 V, respectively, for the two reading-mode operations. As indicated above, channel hot-electrons are provided for tunneling to floating-gate layer 34 by the pinch-off region formed near the virtual source of transistor 82. As known in the semiconductor MOS art, the pinch-off region is present when transistor 81 is in the classical "saturation" mode of operation, as defined by the relationship $V_{DS} > (V_{GR} - V_{T,81})$, where $V_{T,81}$ is the threshold voltage of transistor 81. For this preferred embodiment of the present invention, the threshold voltage for transistor 81 $V_{T,81}$ is ~1 V, which yields a value of ~0.2 V for the quantity $(V_{GS} - V_{T,81})$. As can be seen, the $V_{DS}$ values of 2.24 V and 3.84 V for the read-mode operations are both greater than 0.2 V and, hence, a pinch-off region is formed whereby channel hot electrons may be injected into layer 34. It may be appreciated that the number of hot electrons generated with sufficient energy and direction to tunnel to layer 34 is greater in the case of the drain potential being at 3.84 V (when the second reading-mode operation is used) rather than the case of the drain potential being at 2.24 V (when the first reading-mode operation is used).

Depending upon structural parameters and applied voltages, the time required for lowering the floating-gate voltage to the above specified values of $V^0_{FG,P}$ during programming preferably ranges between approximately 2 microseconds to approximately 200 microseconds. As mentioned above, the charge difference between erase and program states is approximately 10 fC. From the well-known equation Q=I*t, where I is average tunneling current and t is time, the average program tunneling current required to add 10 fC to floating-gate layer 34 of this preferred embodiment would be ~5 nano-amperes for 2 microseconds and ~0.5 nano-amperes for 200 microseconds. The "programming time" may be determined empirically for a specific cell structure and set of applied voltages. It may be appreciated that, in practicing the present invention in the context of a memory array device, one may use a fixed programming time which is related to the empirically determined programming time plus an extra amount of time to account for process and voltage variations. It may also be appreciated that the memory cell may be periodically "tested" during the programming operation by a read-mode operations to determine the effectiveness of the programming time and voltages and thereby determine when to end the programming operation.

In terms of programming current, the memory cell of this embodiment of the present invention draws approximately 1 mA to 4 mA of current during the programming operation. This amount of current at ~7 V to ~10 V can be readily provided by an on-chip high-voltage generator comprising, for example, a charge pump or voltage-doubling circuit. Therefore, it may be appreciated that a memory cell and array device according to the present invention may be entirely operated from a single 5-V power source, i.e., a so-called 5-V-only memory device. It may be further appreciated that it may be possible to further optimize the structure of the present invention such that a programming voltage of 5 V could be used instead of ~7–10 V. This would also result in a 5-V-only memory device.

It may be appreciated that the EPROM memory device art currently teaches that the programming current is on the order of 50 mA to 300 mA at a voltage much higher than the ~7 V–10 V range used in the preferred embodiment of the present invention. Thus, it may be appreciated that the above features of the present invention lead to more than a ten-fold reduction in the high-voltage current consumption for this and other preferred embodiments of the present invention over that currently taught in the EPROM art. The reduction in current consumption in the present invention is substantially matched by an increase in the efficiency of hot-electron generation and of tunneling of hot-electrons in the floating gate. In this preferred embodiment, the increased efficiency is due to the following means: (1) lowering the potential on second layer 40 which, it is believed, increases the percentage of hot-electrons per total current flow, (2) the step reduction of oxide thickness (e.g., 40 nm to 20 nm) between substrate channel areas 51 and 52, which introduces a substantially perpendicular field component into floating-gate layer 34 from area 51 that increases the number of hot-electrons tunneling into the floating gate, and (3) the substantial amount of voltage being coupled to floating-gate layer 34 from substrate region 22, which furthers this perpendicular field component.

In contrast, the EPROM art currently does not teach these means for increasing hot-electron tunneling efficiency and, in fact, teaches against the substantial voltage coupling from substrate region 22 to floating-gate layer 34 and against the lowering of potential on second layer 40. More specifically, the EPROM art teaches the minimizing of capacitive coupling from the floating gate to the substrate regions, such as regions 20 and 22, and the maximizing of capacitive coupling from the floating gate to a control electrode, which serves the function of a selecting the memory cell during programming operations. Along these lines, the EPROM art teaches the coupling of high potential, typically on the order of 10 volts and more, to the control electrode during programming, for the purpose of increasing the total number of injected hot-electrons by increasing the total current flow, which is not the same as increasing the efficiency of hot-electron generation and injection.

A similar analysis for the required conditions for the erase operation may be done. The purpose of the following discussion is to provide the constraints on the erasure voltage $V_{ERASE}$ applied to second layer 40 and the tunneling threshold voltage $V_{TUN}$ needed to ensure that the floating gate voltage for the erase state $V^1_{FG,R}$ is set correctly at the end of the erasure operation. As mentioned above, the floating gate voltage for the second state $V^1_{FG}$ is set during the erase operation. This is because an erase operation, in this embodiment, is performed first and the resulting charge state of the floating gate layer is maintained during the writing (maintaining) of the second binary state, as given in the "Write Second State" column of TABLE I. Therefore, the floating gate voltage for the second state $V^1_{FG}$ is set during the erase operation.

The floating gate voltage at the end of the erasure operation, while the erasure voltages are still applied, is substantially equal to the floating gate voltage at the ground state $V^1_{FG,G}$ a plus the erasure coupling voltage $\Delta V_E$:

$$V_{FG,E}{}^1 = V_{T,FG} + V_{MAR} - \Delta V_R + \Delta V_E \tag{11}$$

where the subscript "E" on the floating gate voltage $V_{FG}$ represents the end of the erasure state. From the above coupling coefficients and from the voltages given in TABLE I for the "Erase Memory State" column, the voltage change $\Delta V_E$ may be calculated according to equation 3 as simply $0.2 * V_{ERASE}$, where $V_{ERASE}$ is the potential applied to second layer 40 (e.g., 20 V or greater). Equation 11 may then be re-written as:

$$V_{FG,E}{}^1 = V_{T,FG} + V_{MAR} - \Delta V_R + 0.2 * V_{ERASE} \tag{12}$$

As mentioned above, the potential difference between second layer 40 and floating gate layer 34 settles to a value substantially equal to the tunneling threshold voltage $V_{TUN}$. In other words, at the end of the erasure operation the following relationship substantially holds: $V_{ERASE} - V_{TUN} = V^1_{FG,E}$. This relationship may be combined with equation 12 at the point of $V^1_{FG,E}$ to yield:

$$V_{ERASE} - V_{TUN} = V_{T,FG} + V_{MAR} - \Delta V_R + 0.2 * V_{ERASE} \tag{13}$$

which can be simplified as:

$$0.8 * V_{ERASE} - V_{TUN} = V_{T,FG} + V_{MAR} - \Delta V_R \tag{14}$$

Given the threshold voltage $V_{T,FG}$, margin voltage $V_{MAR}$, and read coupling voltage $\Delta V_R$, equation 14 provides a design relationship for $V_{ERASE}$ and $V_{TUN}$. In other words, the quantity $(0.8 * V_{ERASE} - V_{TUN})$ for this preferred embodiment of the present invention is set to a constant (the right-hand-side of equation 14), which depends upon which reading-mode operation is used. This constant is approximately 1.4 V when the first reading-mode operation is used in the practicing of this preferred embodiment, and is approximately 3.0 V when the second reading-mode operation is used. In this preferred embodiment of the present invention, the structure of the memory cell is designed to yield a tunneling threshold of approximately 14.5 volts. Thus, the erase voltage $V_{ERASE}$ is approximately 20 V when the first reading-mode operation is used in practicing this preferred embodiment and is approximately 22 V when the second reading-mode operation is used.

In the preferred embodiment of the present invention, the voltage $V_{ERASE}$ may be generated by an "on-chip" high-voltage charge-pump-type generator, such as that taught in U.S. Pat. No. 4,326,134 issued to Owen, et al. In the preferred embodiment of the present invention, the time required for an erasure operation is on the order of a few milliseconds or less.

Having thus described a detailed analysis for the means for programming, erasing, and reading from memory cell 15 for a preferred embodiment of the present invention, a discussion of practicing these operations in the context of a memory array is now given with reference to FIGS. 1 and 2 and Table 1 above. During any of the erase, write, and read operations detailed above, all word lines except for a selected word line (e.g. second layer 40) are set in an unselected voltage state, such as 0 volts. This may be seen in the fifth row of TABLE I where the voltages for second layer 45, which represents all unselected layers, are provided as 0 volts for both write operations, the erase operation, and for both reading-mode operations.

For the erase operation in the preferred embodiments of the memory device according to the present invention, all the memory cells underlying a selected word line, such as second layer 40, are erased at the same time. As discussed below in greater detail, this allows for page-erasable and page-programmable features (the former feature is not currently found in FLASH-Erasable EPROM devices). After the memory cells along a selected word line have been erased, each cell can be selectively programmed, as discussed below.

For memory devices employing a standard ground array ("true ground"), programming and reading may occur for one or all of the memory cells underlying a selected word line. In a virtual-ground array embodiment of the memory device according to the present invention, however, not all of the memory cells underlying a selected word line may be programmed or read at the same time. This is because of the dual functionality of the bit lines, i.e. that of serving selectively as ground line or as a bit line, of a virtual-ground array structure. The operations of programming and erasing in a virtual ground array topology are discussed below in greater detail.

As indicated in TABLE I, substrate region 24 is grounded during the programming operations of memory cell 15, shown in FIGS. 1 and 2. In this case, a current flows from substrate region 24 to substrate region 22 in the right-adjacent memory cell to memory cell 15. Although substrate region 22 is raised to a relative high potential, few hot-electrons are tunneled onto to the floating gate of this right-adjacent memory cell because the current in the right-adjacent memory cell is directed away from its corresponding floating gate layer and in a direction opposite to that in normal programming. As an alternative, substrate region 24 may be left in a floating state to minimize this current through the right-adjacent memory cell. This may be important when an on-chip high voltage generator is used to provide the voltage of approximately 7 volts to approximately 10 volts to substrate region 22. As an additional alternative, a somewhat higher voltage of approximately 5 volts may be applied to substrate region 24 to prevent or reduce the current flowing in the right-adjacent memory cell. For the memory cell left-adjacent to memory cell 15, substrate region 20 is at 0 volts, since it is serving as a ground line in this instance, and no programming of the floating gate layer of this left-adjacent memory cell occurs.

For programming the memory cells along a entire word line (row), it may be appreciated that a number of approaches may be used. For example, using the voltages given in TABLE I, one may first program the even-numbered memory cells along a selected word line followed by programming the odd-numbered memory cells. This would allow the even-numbered bit lines to be first used as true bit lines and then used as reference potential (ground) lines, and vice versa for the odd-numbered bit lines. As another approach, the memory cells along a word line may be programmed by a series of three separate programming operations in which each separate operation programs one third of the memory cells of the selected word line. In such a separate operation, every third cell is programmed. This allows the bit lines adjacent a cell which is being programmed to be left in a floating state so as to minimize the current draw to the surrounding bit lines. For example, substrate region 20 would be grounded to near 0 volts, substrate region 22 would be placed at the programming voltage of approximately 7 volts to 10 volts, and substrate region 24 and the substrate region to the left of region 20 would both be left in a floating state. As a final programming approach, the memory cells along a selected word line may be programmed one at a time and in sequential order, starting from end of the word line to the other end.

For reading operations, the current flow between adjacent bit lines is used to sense the state of the floating-gate layer 34 of the memory cell underlying the selected word line. As such, it is important that currents to adjacent cells be either prevented or accounted for. In the first reading-mode and second reading-mode shown in TABLE I, the potential of substrate region 24 tracks the potential of substrate region 22 so that no current flows between these regions, thus allowing the current into substrate region 22 to be reflective of the stored state on floating gate 34. It may also be appreciated that substrate region 24 may be left in a floating state so as to not conduct current from substrate region 22.

In terms of reading information from all the memory cells in a selected word line, it may be appreciated that a number of ways may be used to access information in all of the memory cells, just as there are in the programming operation. For example, one cell at a time may be read out or every third cell may be read out in a manner similar to that indicated above for the programming operation. In addition, it may be appreciated that the memory operation may be done in two phases, in the first phase reading the even-numbered cells and in the second phase reading the odd-numbered cells. This may be readily done when the first reading-mode operation is used in practicing the present invention. As another way, it may be appreciated that for reading a byte of data, that a word line may contain several interleaved bytes of data. In such a case, the bit lines may be arranged such that all the bits in the desired byte may be read in one step from the associated word line.

ARRAY EMBODIMENTS

Having generally described practicing the read, erase, and programming operations in the context of a memory array, further features of the present invention, demonstrated in the form of a further preferred embodiment of the memory array of the present invention, are now given. This further embodiment is intended to demonstrate the page-erasable and virtual-ground array features of the present invention as well as other further refinements of the present invention.

A first preferred embodiment of an integrated circuit memory device according to the present invention is shown at 100 in FIG. 5. As with array 10 in FIGS. 1 and 2, memory device 100 is disposed on a substrate 12 of a first conductivity type having a first surface 13. Memory device 100 comprises an array 110 of memory cells according to the present invention, as for example memory cell 15 shown by FIGS. 1 and 2, and means for interconnecting a plurality of such memory cells. As interconnecting means, memory array 110 includes a plurality of rows disposed substantially parallel to one another and a plurality of columns disposed substantially parallel to one another and substantially perpendicular to the rows of array 110. Each row of array 110 comprises a word line, shown at 141, 142, . . . ,149 in FIG. 5 and the columns of array 110 each comprise a bit line of a virtual-ground array topology, each bit line being shown at reference numerals 121, 122, . . . 129. Array 110 further includes a grounding bit line $B_E$ shown at 120 at the left end of array 110 to complete the virtual-ground memory array structure. In the preferred embodiments of memory device 100, array 110 comprises 512 rows and 512 columns to form a 256K-bit memory array. For ease of reference, the word lines 141, 142, . . . 149 are also labeled as $W_1$ through $W_M$, the bit lines 121, 122 . . . 129 are labeled as $B_1$ through $B_N$, and the grounding bit line is labeled as $B_E$.

Memory cells 15 of the present invention are interconnected into array 110 in the following manner. With the exception of grounding bit line 120 ($B_E$), one memory cell 15 is disposed at each intersection of a row and column. For a memory cell that is disposed in the $i^{th}$ row and the $j^{th}$ column, the second layer 40 of the memory cell is electrically coupled to word line $W_i$, the second substrate region 22 is electrically coupled to bit line $B_j$, and the first substrate region 20 is electrically coupled to the preceding, adjacent bit line $B_{j-1}$, or $B_E$ when j=1. The above-described connection of memory cell 15 into array 110 demonstrates the ability of the present invention to be incorporated into a virtual-ground array topology, and thereby furthers the compact nature of a memory cell according to the present invention by eliminating the need for a separate, dedicated grounding system.

Memory array device 100 further comprises an address port 101 for receiving a plurality of address lines, a control port 102 for receiving a plurality of control signals for controlling the reading and writing operation of memory device 100, and a data I/O port for receiving a plurality of data I/O lines. In the preferred embodiment of memory array device 100, address port 101 receives 15 address lines represented as A[14:0], data port 103 receives 8 data I/O lines represented as I/O[7:0], and control port 102 receives 3 control signals. Further, the control signals received at port 102 are the standard chip enable signal CE\, the output enable signal OE\, and the write enable signal WE\. As the functionality of these control signals is well known to the semiconductor memory art, a derailed discussion of the functionality of these control signals is not provided.

Memory device 100 further comprises a word line control means 150 which is responsive to the high-order address lines [14:6] and the control signals at port 102 and is for selecting the appropriate row word line $W_1$ through $W_M$ as specified by the high-order address and the instructions provided to control port 102. Word line control means 150 uses the high-order address lines A[14:6] to uniquely select one of the word lines $W_i$ from the total word lines $W_1$ through $W_M$, as known in the semiconductor memory art. For this, means 150 comprises output select lines 151, 152, . . . ,159 coupled to word lines 141, 142, . . . ,149, respectively, which are thereby coupled to the respective second layers 40 of the memory cells 15 in the corresponding word lines (rows). As indicated above, the second layer 40 of memory cell 15 provides means for enabling the selection of the programming means, erasure means, and sensing (reading) means for memory cell 15, particularly when memory cell 15 is formed as part of a memory array of such cells. Thus, the selection of one of word lines 141, 142, . . . ,149 enables the selection of the programming means, erasure means, and sensing (reading) means for the memory cells 15 coupled to the selected word line. As such, word line control means comprises an address means for selecting a word line in array 110 for the programming means, erasure means, and sensing (reading) means of the present invention.

Memory device 100 further comprises a column control means 160 responsive to the low-order address bits A[5:0], the control signals at port 102, and the data signals at port 103 for exchanging data between port 103 and the columns of array 110 as required by the read/write instructions provided at port 102 and the address lines A[5:0]. Column control means 160 uses address lines A[5:0] to uniquely select one byte (a group of 8 bits) from a total of 64 such bytes in the selected row for exchanging data between port 103 and the selected row.

In conjunction with the interconnecting means, memory device 100 further comprises a grounding means for selectively coupling a reference potential to the memory cells within array 110. In the virtual-ground topology, the grounding means is provided by column control means 160 discussed above and by the electrical couplings between the first substrate regions 20 of the memory cells to adjacent bit lines, as discussed above. In a standard ground array topology, the grounding means may be provided by dedicated ground lines disposed parallel to either the word lines or bit lines and by electrical couplings between the first substrate regions 20 of the memory cells and the dedicated ground lines.

This organization of word lines with 512 bits associated with each word line is commonly referred to as a page word-line organization. With this organization in the present invention, one may erase a page of data by selecting a single word line, and then subsequently write an entire page of data into the erased memory cells along the selected word line. Specifically, with 512 columns, there are 512 memory cells 15 for each row or word line 141, 142, ... ,149. Therefore, the selection of a given word line by control means 150 enables the programming means to write a page of binary data, the sensing means to read a page of binary data, and the erasure means to erase a page of binary data. In many uses of nonvolatile memory array devices, as well as volatile RAM memory array devices, information is often read and written to the memory devices on a page basis as system storage for program and data segments are often organized in groups of pages (e.g., computer cache memory). Thus, the present invention has the capability of conforming to the page organization of many application users.

In contrast, prior art EPROM memory cells are organized to erase the entire array with U-V light exposure, and flash EPROM memory devices are organized to erase along columns rather than rows (i.e., these EPROMS erase memory cells along a selected column). However, such EPROM devices use row-oriented addressing for reading and programming. Thus, to re-write information along a selected row in these EPROM devices, each column intersecting the selected row must be erased, which thereby erases several other rows that are not intended to be re-written. Therefore, these EPROM memory arrays generally erase the entire memory array, or substantial portions thereof spanning many pages, before the EPROM memory device may be reprogrammed. When reprogramming is undertaken, many row word lines must be rewritten, at the expense of time to re-write the data which was not intended to be re-written and at the expense of reducing the endurance of the EPROM cells. In this respect, the page-eraseability feature of the present invention provides a significant advantage.

Related to the page-erasable feature of the present invention is a page-write feature. Many nonvolatile EEPROM memory devices provide, as an industry standard convention for EEPROM devices, a means for writing an entire page of data at one time so as to reduce the average writing time to the EEPROM memory device. This is known as the page-write mode in the EEPROM art. As the selecting means, erasure means, and programming means of the present invention are organized along word line boundaries, a memory array according to the present invention is capable of writing 512 bits of data to a single selected word line and is therefore incompatible with the page-writing convention now used in the industry.

For the page-write feature, memory device 100 further comprises a page-write control means 170 which is responsive to the address lines at port 101 and the control lines at 102 for coordinating the operations of word line control means 150 and column control means 160 during a page-write operation. During a page write, word line control means 150 and column control means 160 are instructed to first erase the memory cells along the selected word line, as specified by address lines A[14:6], and then to receive the data to be written to the erased cells in the selected word line. By the page-write convention, 512 bits of data are then provided to column control means 160 for writing into the memory cells underlying the selected word line. These bits are provided as 64 bytes which are provided to I/O port 103 in a serial manner as I/O port 103 accepts a byte at a time. It may be appreciated that the user may, during the acceptance of the page bytes, provide a corresponding identification on address lines A[5:0] along with each byte so that column control means 160 may properly route the bits in each byte to the memory cells along the selected word line. It may also be appreciated that memory device 100 may be designed such that the user may provide these bits in sequential address order to I/O port 103 and that column control means 160 may automatically route the bits to the proper columns without the need for the corresponding identifications on address lines A[5:0]. It may be further appreciated that column control means 160 may comprise a plurality of column data latches equal in number to the number of columns in array 110 for temporarily storing of the bits in the 64 bytes. After receiving all bits to be written, column control means 160 may then proceed to transfer the bits of the column data latches to the corresponding nonvolatile memory cells of the selected word line, as for example by any of the above-described ways.

For reading and programming, it may be appreciated that column control means 160 may use any of the above discussed methods for reading and programming cells in the context of a virtual-ground topology. As such, memory array 100 comprises, as part of column control means 160, a grounding means for selectively coupling a reference potential to selective bit lines 120, 121, ... ,129 in array 110 as needed during the reading and programming operations. For erasure, column control means 160 comprises means for substantially grounding each of the bit lines 120,121, ... ,129 while the potential of the selected word line is raised to an appropriate erase voltage.

Thus, it may be appreciated that device 100 provides a page organized and page erasable/programmable device. It may be further appreciated that the selection of one of the row word lines $W_1-W_M$ of device 100 during an a erase operation thereby erases a page of binary data within device 100 and that the selection of the same row word line during a programming operation allows the writing of a page of binary data to memory device 100. This significantly increases the ease of use of the memory devices according to the present invention in contrast to conventional EPROM memory devices in which the erase operation is not readily organized around the use of the word line, as indicated above. Thus, this page-eraseability and page-addressability feature of the present invention provides full-feature capabilities while maintaining a compact memory cell size.

Having thus described the above features of the present invention in the context of a preferred embodiment of the memory device, further refinements of the array structure according to the present invention are provided with reference to the memory device shown in FIG. 5. These refinements provide means for reducing the distributed resistance of the word and bit lines of an array according to the present invention, such as array 110. It may be appreciated that the word lines may comprise polysilicon material having a sheet resistivity ranging between 20 and 200 ohms per square. For a large array, such a high resistance may significantly increase the time required for reading, programming, and erasure operations. Likewise, the bit lines may comprise a substrate doped region which has a sheet resistivity on the order of 10 to 50 ohms per square. Such a high resistivity may also contribute to an increase in time for performing reading, programming, and erasure operations.

To overcome the effects of the high resistivity in both of these cases, the memory device of the present invention further comprises, for each word or bit line, a strapping means for reducing the electrical resistance of a corresponding word line or bit line. Each such strapping means is disposed parallel to its corresponding word line or bit line and makes electrical contact to its corresponding word line or bit line at predetermined, periodic spatial locations along its corresponding line. In general, the strapping means comprises a metal line which has a resistivity on the order of 0.03 ohms to 1 ohm per square. In further embodiments of the strapping means, the strapping means for the word lines are disposed above the word lines and isolated by dielectric from other conductors except at the periodic contact points to the corresponding word line. For the bit line, the strapping means may be disposed above the corresponding bit line and isolated by dielectric from other conductors in a similar manner or may be disposed in the substrate in the form of a "buried bit line" structure.

An exemplary strapping means for a word line is shown at 180 in FIG. 5 for word line $W_4$, reference numeral 144. Strapping means 180 makes contact to word line 144 at predetermined spaced contacts 181, 182, and 183 through the dielectric material which separates the strapping means from word line 144. In a similar fashion, an exemplary strapping means 190 for bit line 124 ($B_3$) is shown in FIG. 5. Strapping means 190 makes contact to bit line 124 at contacts 191, 192, and 193 through the dielectric material which separates strapping means 190 and bit line 124. Although only one strapping means for each of a word line and bit line are shown in FIG. 5, it may be appreciated that corresponding strapping means may be provided for all word lines and all bit lines in the memory array according to the present invention. Due to the visual complexity of FIG. 5, a strapping means for each word line and each bit line are not shown so as to simplify the discussion of FIG. 5 and to make FIG. 5 more understandable.

While the present invention has been particularly described with respect to the illustrated embodiments, it will be appreciated that various alterations, modifications and adaptations may be made based on the present disclosure, and are intended to be within the scope of the present invention. While the present invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A nonvolatile floating gate device comprising:

a substrate of a first conductivity type having a first surface, a first substrate region and a second substrate region, each said substrate region being disposed in said first surface and being of a second conductivity type opposite to said first conductivity type;

a first electrically insulated conductive layer spaced from said first surface having a first portion capacitively coupled to said second substrate region and a second portion overlaying a first predetermined channel area of said first surface disposed between said first substrate region and said second substrate region, said second portion spaced from said first channel area by a first spacing distance;

a second electrically insulated conductive layer having a first portion spaced from said first surface and disposed generally intermediate said first substrate region and said second portion of said first layer and a second portion overlaying said first layer, said first portion of said second layer overlaying a second predetermined channel area of said first surface and being spaced therefrom by a second spacing distance;

programming means for selectively tunneling hot electrons onto said first layer from at least said second channel area substantially only by hot electron injection, said programming means comprising a first application means for selectively applying a first potential to said first substrate region, a second application means for selectively applying a second potential to said second substrate region, and a third application means for selectively applying a program control potential to said second layer, said program control potential being selected to invert the conductivity type of said second channel area to provide a conduction path between said first substrate region and said first channel area, said first and second application means acting to create a potential difference between said first and second substrate regions, said capacitive coupling between said first portion of said first layer and said second substrate region coupling a substantial amount of said second potential to said first layer, said programming means forming a primary inversion region in said second channel area adjacent to said first substrate region, a primary pinchoff region in said second channel area and adjacent to said primary inversion region, and a secondary inversion region in said first channel area and adjacent to said primary pinchoff region, said primary pinchoff region being formed such that hot electrons are generated therein and caused to tunnel from said substrate surface to said first layer by hot electron injection; and means for sensing the potential of said first layer; and wherein the position of said second substrate region in relation to said first substrate region defines a first direction, said first direction being directed from said first substrate region to said second substrate region, and wherein said first portion of said first layer overlays substantially the entire length of said second substrate region along said first direction; and wherein said first spacing distance is less than said second spacing distance such that a step in the thickness of the dielectric layer is formed above said primary pinchoff region to enhance the tunneling of hot electrons from said substrate to said first layer during programming.

2. The nonvolatile floating gate device of claim 1 wherein at least 25 percent of said second potential is capacitively coupled to said first layer.

3. The nonvolatile floating gate device of claim 1 wherein said first layer capacitively coupled to said second layer, and wherein the capacitive coupling between said first portion of said first layer and said second substrate region is greater than one third of the capacitive coupling between said first layer and said second layer.

4. The nonvolatile floating gate device of claim 1 wherein said first layer is capacitively coupled to said second layer, and wherein the capacitive coupling between said first portion of said first layer and said second substrate region is greater than the capacitive coupling between said first layer and said second layer.

5. The nonvolatile floating gate device of claim 1 wherein said second region includes a first perimeter edge, said second region being disposed between said first perimeter edge and said first substrate region, the surface of said first perimeter edge defining a first plane perpendicular to said substrate such that said first plane comprises said first perimeter edge, and wherein said first portion of said first layer is disposed substantially on the same side of said first plane as said second region.

6. The nonvolatile floating gate device of claim 5 wherein said first layer comprises a perimeter side face substantially coinciding with said first plane.

7. The nonvolatile floating gate memory device of claim 1 wherein said programming means further comprises means for applying one of a first data potential difference and a second data potential difference between said first and second substrate regions, said first data potential difference being applied when data to be stored in said device has one binary state, said second data potential difference being applied when data to be stored in said device has the other binary state, said first data potential difference and said program control potential being selected such that electrons are tunneled onto said first layer from said substrate upon application of said first data potential difference between said first and second substrate regions and application of said program control potential to said second layer.

8. The nonvolatile floating gate device of claim 7 wherein said second data potential difference is selected such that electrons are prevented from being tunneled onto said first layer from said substrate 12 upon application of said second data potential difference between said first substrate region and said second substrate region and application of said program control potential to said second layer.

9. The nonvolatile floating gate memory device of claim 8 further comprising erasure means for selectively tunneling electrons from said first layer to said second layer, said erasure means acting to remove said electrons from said first layer before said second data potential difference is applied between said first and second substrate regions by said programming means.

10. The nonvolatile floating gate memory device of claim 7 wherein said erasure means further acting to remove said electrons from said first layer before said first data potential difference is applied between said first and second substrate regions by said programming means.

11. The nonvolatile floating gate memory device of claim 7 wherein said first potential comprises a first bias potential and wherein said second potential comprises one of a first data potential and a second data potential, said first data potential being applied when data to be stored in said device has one binary state, said second data potential being applied when data to be stored in said device has the other binary state, said first bias potential and said first data potential being selected such that electrons are tunneled onto said first layer from said substrate upon application of said first data potential to said second substrate region, said first bias potential to said first substrate region, and said program control potential to said second layer.

12. The nonvolatile floating gate memory device of claim 7 wherein said second potential comprises a first bias potential and wherein said first potential comprises one of a first data potential and a second data potential, said first data potential being applied when data to be stored in said device has one binary state, said second data potential being applied when data to be stored in said device has the other binary state, said first bias potential and said first data potential being selected such that electrons are tunneled onto said first layer from said substrate upon application of said first data potential to said second substrate region, said first bias potential to said first substrate region, and said program control potential to said second layer.

13. The nonvolatile floating gate device of claim 1 wherein said sensing means comprises:

a reference potential and a sense potential;

means for selectively applying one of said reference potential and said sense potential to said first substrate region;

means for selectively applying the other of said reference potential and said sense potential to said second substrate region; and means for selectively applying a sense control potential to said second layer, said sense control potential being selected to invert the conductivity type of said substrate underlying said first portion of said second layer to provide a conduction path between said first substrate region and said first channel area, said sense potential and reference potential being selected to develop a potential difference across said first channel area, the conductivity of said first channel area being a function of the stored binary state of said first layer, said potential difference developing a sense current between said first substrate region and said second substrate region such that the magnitude of said sense current is a function of said stored binary state.

14. The nonvolatile floating gate device of claim 1 further comprising erasure means for selectively tunneling electrons from said first layer to said second layer.

15. The nonvolatile floating gate device of claim 14 wherein said erasure means comprises:

means for selectively applying a first bias potential to said first substrate region;

means for selectively applying a second bias potential to said second substrate region;

means for selectively applying an erase control potential to said second layer, said erase control potential, said first bias potential and said second bias potential being selected such that electrons are tunneled from said first layer to said second layer upon application of said first bias potential to said first substrate region, said second bias potential to said second substrate region, and said erase control potential to said second layer.

16. The nonvolatile floating gate device of claim 15 wherein said third bias potential is substantially equal to said second bias potential.

17. The nonvolatile floating gate device of claim 14 wherein said erasure means for selectively tunneling electrons from said first layer to said second layer comprises one or more enhanced emission structures disposed on said first layer, each said emission structure comprising a rounded emitting surface having a radius of curvature which enables an enhancement of the local electric field near said rounded emitting surface.

18. The nonvolatile floating gate device of claim 17 wherein said second portion of said second layer is spaced from said first layer 34 by a selected distance, and wherein the value of said radius of curvature is less than said distance between said first layer and said second layer.

19. The nonvolatile floating gate device of claim 17 wherein said first layer further comprises a top surface disposed away from said first surface of said substrate and a perimeter side face disposed perpendicular to said first surface of said substrate, and wherein one of said enhanced emission structures comprises a corner edge of said first layer disposed between said top surface and said side face and facing said second layer.

20. The nonvolatile floating gate device of claim 19 wherein said corner edge forms an acute angle between said top surface and said face.

21. The nonvolatile floating gate device of claim 14 wherein said first layer further comprises a top surface disposed away from said first surface of said substrate and wherein said erasure means comprises a texturized surface disposed on said top surface of said first layer, said texturized surface comprising a plurality of enhanced emission structures.

22. An integrated circuit memory device comprising:

a substrate of a first conductivity type having a first surface;

a plurality of nonvolatile memory cells interconnected as an array of such cells, said array having a plurality of rows disposed substantially parallel to one another and a plurality of columns disposed substantially parallel to one another and substantially perpendicular to said rows, each said row comprising a word line and each said column comprising a bit line, one said memory cell disposed per intersection of each said row and each said column;

grounding means for selectively coupling a reference potential within said array; and each of said memory cells comprising:

a first substrate region electrically coupled to said grounding means and a second substrate region electrically coupled to the corresponding bit line of said memory cell, each said substrate region being disposed in said first surface and being of a second conductivity type opposite to said first conductivity type;

a first electrically insulated conductive layer spaced from said first surface having a first portion capacitively coupled to said second substrate region and a second portion overlaying a first predetermined channel area of said first surface disposed between said first substrate region and said second substrate region, said second portion spaced from said first channel area by a first spacing distance;

a second electrically insulated conductive layer electrically coupled to the corresponding word line of said memory cell, said second layer having a first portion spaced from said first surface and disposed generally intermediate said first substrate region and said second portion of said first layer and a second portion overlaying said first layer, said first portion of said second layer overlaying a second predetermined channel area of said first surface, said first layer being capacitively coupled to said second layer and being spaced therefrom by a second spacing distance;

programming means for selectively tunneling hot electrons onto said first layer from at least said second channel area substantially only by hot electron injection, said programming means comprising a first application means for selectively applying a first potential to said first substrate region, a second application means for selectively applying a second potential to said second substrate region, and a third application means for selectively applying a program control potential to said second layer, said program control potential being selected to invert the conductivity type of said second channel area to provide a conduction path between said first substrate region and said first channel area, said first and second application means acting to create a potential difference between said first and second substrate regions, said capacitive coupling between said first portion of said first layer and said second substrate region coupling a substantial amount of said second potential to said first layer, such that hot electrons are generated in at least said second channel area and caused to tunnel from said substrate surface to said first layer, said programming means forming a primary inversion region in said second channel area adjacent to said first substrate region, a primary pinchoff region in said second channel area and adjacent to said primary inversion region, and a secondary inversion region in said first channel area and adjacent to said primary pinchoff region, said primary pinchoff region being formed such that hot electrons are generated therein and caused to tunnel from said substrate surface to said first layer by hot electron injection, wherein said first spacing distance is less than said second spacing distance such that a step in the thickness of the dielectric layer is formed above said primary pinchoff region to enhance the tunneling of hot electrons from said substrate to said first layer during programming; and means for selectively sensing the potential of said first layer; and wherein at least one of said word lines comprises the second layers of the memory cells disposed within its row such that said second layers form said at least one word line as a continuous strip of conductive material.

23. The integrated circuit memory device of claim 22 wherein at least 25 percent of said second potential is capacitively coupled to said first layer of said at least one memory cell.

24. The integrated circuit memory device of claim 22 wherein said first layer of said memory cell is capacitively coupled to said corresponding second layer, and wherein the capacitive coupling between said first portion of said first layer of said memory cell and said corresponding second substrate region is greater than one third of the capacitive coupling between said first layer of said memory cell and said corresponding second layer.

25. The integrated circuit memory device of claim 22 wherein said at least one of said memory cells further comprises erasure means for selectively tunneling electrons from said first layer to said second layer, and wherein said second layer is responsive to said corresponding word line and is further for enabling the selection of said programming means, said sensing means, and said erasure means for said memory cell.

26. The integrated circuit memory device of claim 25 wherein said erasure means of at least one said nonvolatile memory cell comprises:

a first means for selectively applying a first bias potential to said first substrate region of said at least one memory cell;

a second means for selectively applying a second bias potential to said second substrate region of said at least one memory cell;

a third means for selectively applying an erase control potential to said second layer of said at least one memory cell, said erase control potential, said first bias potential and said second bias potential being selected such that electrons are tunneled from said first layer of said at least one memory cell to said second layer upon application of said first bias potential to said first substrate region, said second bias potential to said second substrate region, and said erase control potential to said second layer.

27. The integrated circuit memory device of claim 22 wherein said programming means of at least one said nonvolatile memory cell further comprises means for selectively applying one of a first data potential difference and a second data potential difference between said first substrate region and said second substrate region of said at least one memory cell, said first data potential difference being applied when data to be stored in said at least one memory cell has one binary state, said second data potential difference being applied when data to be stored in said at least one memory cell has the other binary state, said first data potential difference being selected such that electrons are tunneled onto said first layer of said at least one memory cell from said substrate upon application of said first data potential difference between said first substrate region and said second substrate region, and application of said program control potential to said second layer.

28. The memory device of claim 22 wherein said grounding means comprises means for coupling the first substrate region of at least one memory cell to the bit line of an adjacent memory cell to form a virtual ground array structure.

29. The memory device of claim 25 wherein said device further comprises an address means for selecting a word line, and wherein the number of memory cells along a given row in said array is equal in number to a page of binary data, such that the word line of said given row enables said programming means to write a page of binary data, said sensing means to read a page of binary data, and said erasure means to erase a page of binary data when the word line for said given row is selected by said address means.

30. The memory device of claim 22 wherein at least one of said rows comprises a strapping means for reducing the electrical resistance of its corresponding word line, each said strapping means disposed parallel to its corresponding word line and making electrical contact to its corresponding word line at predetermined, periodic spatial locations along said corresponding word line.

31. The memory device of claim 22 wherein at least one of said columns comprises a strapping means for reducing the electrical resistance of its corresponding bit line, each said strapping means disposed parallel to its corresponding bit line and making electrical contact to its corresponding bit line at predetermined, periodic spatial locations along said corresponding bit line.

32. The device according to claim 1 wherein said floating gate is spaced from said substrate such that electrons are coupled to the floating gate substantially only by hot electron injection when said first potential, second potential, and said program control potential are applied.

33. A nonvolatile floating gate device comprising:

a substrate of a first conductivity type having a first surface, a first substrate region and a second substrate region, each said substrate region being disposed in said first surface and being of a second conductivity type opposite to said first conductivity type;

a first electrically insulated conductive layer spaced from said first surface having a first portion capacitively coupled to said second substrate region and a second portion overlaying a first predetermined channel area of said first surface disposed between said first substrate region and said second substrate region, said portion spaced from said first channel area by a first spacing distance;

a second electrically insulated conductive layer having a first portion spaced from said first surface and disposed generally intermediate said first substrate region and said second portion of said first layer and a second portion overlaying said first layer, said first portion of said second layer overlaying a second predetermined channel area of said first surface and being spaced therefrom by a second spacing distance;

a primary inversion region in said second channel area adjacent to said first substrate region;

a primary pinchoff region in said second channel area and adjacent to said primary inversion region;

a secondary inversion region in said first channel area and adjacent to said primary pinchoff region; and wherein a first potential is applied to said first substrate region, a second potential is applied to said second substrate region, and a control potential is applied to said second layer such that hot electrons are generated in said primary pinchoff region and caused to tunnel from said substrate surface to said first layer by hot electron injection; and wherein a portion of said first channel area adjacent to said second channel area has a positive threshold voltage with respect to said floating gate.

34. The device of claim 33 wherein said threshold voltage is between approximately 2 V and approximately 4 V.

35. The device of claim 33 wherein the entire portion of the first channel area which is overlaid by said first layer has a positive threshold voltage with respect to said floating gate.

36. The device of claim 33 wherein said positive threshold voltage is greater than the threshold voltage between said second layer and said second channel area by at least approximately one volt.

37. The device of claim 35 wherein said positive threshold voltage is between approximately 2 V and approximately 4 V.

* * * * *